(12) United States Patent
Kageyama

(10) Patent No.: US 12,374,589 B2
(45) Date of Patent: Jul. 29, 2025

(54) METHOD FOR MANUFACTURING LIGHT-EMITTING DEVICE

(71) Applicant: NICHIA CORPORATION, Anan (JP)

(72) Inventor: Hiroaki Kageyama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 450 days.

(21) Appl. No.: 18/068,245

(22) Filed: Dec. 19, 2022

(65) Prior Publication Data
US 2023/0207724 A1 Jun. 29, 2023

(30) Foreign Application Priority Data

Dec. 23, 2021 (JP) .................................. 2021-209764

(51) Int. Cl.
H01L 21/66 (2006.01)
H01L 25/075 (2006.01)
H10H 20/01 (2025.01)
H10H 20/841 (2025.01)
H01L 23/00 (2006.01)

(52) U.S. Cl.
CPC .......... *H01L 22/22* (2013.01); *H01L 25/0753* (2013.01); *H10H 20/018* (2025.01); *H10H 20/841* (2025.01); *H01L 24/13* (2013.01); H01L 24/16 (2013.01); H01L 24/29 (2013.01); H01L 24/32 (2013.01); H01L 24/73 (2013.01); H01L 2224/13144 (2013.01); H01L 2224/13147 (2013.01); H01L 2224/16225 (2013.01); H01L 2224/29016 (2013.01); H01L 2224/2919 (2013.01); H01L 2224/32225 (2013.01); H01L 2224/73104 (2013.01)

(58) Field of Classification Search
None
See application file for complete search history.

(56) References Cited

U.S. PATENT DOCUMENTS

2003/0087476 A1 5/2003 Oohata et al.
2020/0321391 A1* 10/2020 Danesh ................ H10H 29/142
(Continued)

FOREIGN PATENT DOCUMENTS

EP 4023689 A1 7/2022
JP 2003077940 A 3/2003
(Continued)

*Primary Examiner* — Feifei Yeung Lopez
(74) *Attorney, Agent, or Firm* — Global IP Counselors, LLP

(57) ABSTRACT

A method for manufacturing a light-emitting device includes: providing an intermediate body having a first ultraviolet transmitting layer, a first adhesive layer, a plurality of first light emitting elements, a second adhesive layer, and a second ultraviolet transmitting layer; disposing on the second ultraviolet transmitting layer of the intermediate body, an ultraviolet shielding layer in a region corresponding to a part of the first light-emitting elements; performing first ultraviolet irradiation of irradiating the intermediate body with ultraviolet from a direction facing the ultraviolet shielding layer; performing second ultraviolet irradiation of irradiating the intermediate body with ultraviolet from a direction facing the first ultraviolet transmitting layer; and separating the part of the first light-emitting elements from the first adhesive layer along with the second adhesive layer.

10 Claims, 18 Drawing Sheets

(56) References Cited

U.S. PATENT DOCUMENTS

| | | |
|---|---|---|
| 2020/0357950 A1 | 11/2020 | Takagi |
| 2021/0043810 A1 | 2/2021 | Igarashi |
| 2021/0057607 A1 | 2/2021 | Lin et al. |

FOREIGN PATENT DOCUMENTS

| | | | |
|---|---|---|---|
| JP | 2003218402 | A | 7/2003 |
| JP | 2019506737 | A | 3/2019 |
| JP | 2019104785 | A | 6/2019 |
| JP | 2019527471 | A | 9/2019 |
| JP | 2020053558 | A | 4/2020 |
| JP | 2020188037 | A | 11/2020 |
| JP | 2021027289 | A | 2/2021 |
| JP | 2021034610 | A | 3/2021 |
| JP | 2021534594 | A | 12/2021 |
| WO | 2018005118 | A1 | 1/2018 |

\* cited by examiner

METHOD FOR MANUFACTURING LIGHT-EMITTING DEVICE

CROSS-REFERENCE TO RELATED APPLICATION

This application claims priority to Japanese Patent Application No. 2021-209764, filed on Dec. 23, 2021, the disclosure of which is hereby incorporated herein by reference in its entirety.

BACKGROUND

An embodiment of the present disclosure relates to a method for manufacturing a light-emitting device.

A light-emitting device in which a large number of light-emitting elements are mounted on one wiring substrate has been developed. In such a light-emitting device, when there is a defective product in the light-emitting elements mounted on the wiring substrate, the defective product needs to be removed and replaced with a non-defective product.

Japanese Patent Publication No. 2019-506737A discloses a method for disposing two adhesive films above and below a plurality of electric elements and selectively exposing one of the adhesive films, thereby selectively replacing the plurality of electric elements.

However, when the light-emitting elements are further reduced in size and the distance between the light-emitting elements is shortened, the method described in Japanese Patent Publication No. 2019-506737A may not be able to replace the light-emitting elements with high accuracy.

SUMMARY

An object of an embodiment of the present disclosure is to provide a method for manufacturing a light-emitting device, which can accurately replace a light-emitting element.

A method for manufacturing a light-emitting device according to an embodiment of the present disclosure includes: providing an intermediate body including a first ultraviolet transmitting layer having a first surface, a first adhesive layer having a second surface in contact with the first surface of the first ultraviolet transmitting layer and a third surface located opposite to the second surface, a plurality of first light-emitting elements in contact with the third surface of the first adhesive layer and each including a light reflecting layer located on a side opposite to a side facing the third surface, a second adhesive layer comprising a fourth surface in contact with the plurality of first light-emitting elements and a fifth surface located opposite to the fourth surface, and a second ultraviolet transmitting layer comprising a sixth surface in contact with the fifth surface of the second adhesive layer and a seventh surface located opposite to the sixth surface; disposing an ultraviolet shielding layer in a region on the seventh surface of the second ultraviolet transmitting layer, the region corresponding to a part of the plurality of first light-emitting elements; performing first ultraviolet irradiation of irradiating the intermediate body with ultraviolet from a direction facing the ultraviolet shielding layer; performing second ultraviolet irradiation of irradiating the intermediate body with ultraviolet from a direction facing the first ultraviolet transmitting layer; and separating the part of the plurality of first light-emitting elements from the first adhesive layer along with the second adhesive layer. After the performing of the first ultraviolet irradiation and the performing of the second ultraviolet irradiation, an adhesive force of a portion of the second adhesive layer irradiated with the ultraviolet is less than an adhesive force of the first adhesive layer, and an adhesive force of a portion of the second adhesive layer not irradiated with the ultraviolet is greater than the adhesive force of the first adhesive layer.

According to an embodiment of the present disclosure, it is possible to implement a method for manufacturing a light-emitting device, which can accurately replace a light-emitting element.

DETAILED DESCRIPTION

Figure 1:
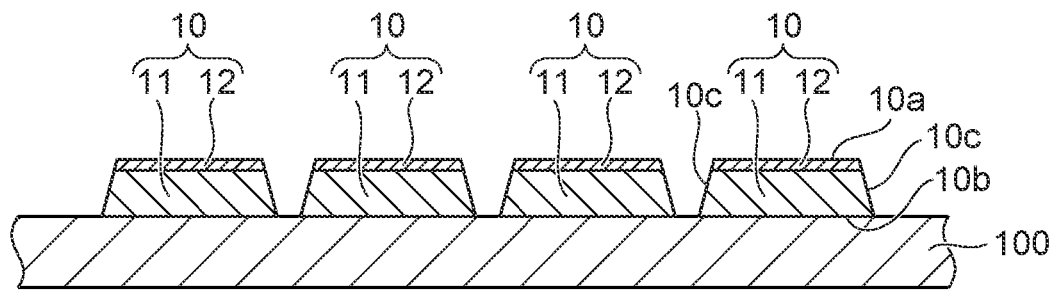
FIG. 1 is a cross-sectional view schematically illustrating a method for manufacturing a light-emitting device according to a first embodiment.

Hereinafter, embodiments will be described with reference to the drawings. Note that the drawings are schematic or conceptual and are appropriately simplified and emphasized. For example, the relationships between thicknesses and widths of portions, the proportions of sizes between portions, and the like are not necessarily the same as the actual values thereof. Further, the dimensions and the proportions may be illustrated differently between the drawings, even in a case in which the same portion is illustrated. As a cross-sectional view, an end view illustrating only a cut surface may be used. In the present description and the drawings, the same elements as those described in relation to the aforementioned drawings are denoted by the same reference numerals, and a detailed description thereof will be omitted as appropriate.

First Embodiment

First, a first embodiment will be described.

FIGS. 1 to 14 are cross-sectional views illustrating a method for manufacturing a light-emitting device according to the present embodiment.

Providing First Light-Emitting Element 10

As illustrated in FIG. 1, a growth substrate 100 is provided. The growth substrate 100 is, for example, a wafer such as sapphire. Subsequently, a plurality of first light-emitting elements 10 are formed on a top surface of the growth substrate 100. For example, a semiconductor layer is grown on the top surface of the growth substrate 100, an electrode layer is formed on the semiconductor layer, and the electrode layer and the semiconductor layer are singulated for each of the first light-emitting elements 10. This results in the plurality of first light-emitting elements 10 arranged in a matrix form on the growth substrate. Furthermore, a semiconductor layer support substrate from which the growth substrate 100 has been removed and in which singulated first light-emitting elements 10 are arranged may be provided in advance.

The first light-emitting element 10 is, for example, a Light Emitting Diode (LED). The first light-emitting element 10 includes a semiconductor portion 11 and a light reflecting layer 12 disposed on the semiconductor portion 11. The semiconductor portion 11 is obtained by dividing the semiconductor layer described above, and a p-type layer, a light-emitting layer, and an n-type layer are layered. The light reflecting layer 12 is a metal layer disposed on substantially the entire surface on the semiconductor portion 11 and includes a pair of electrode layers. The first light-emitting element 10 may include other members such as an insulating layer, in addition to the semiconductor portion 11 and the light reflecting layer 12. In the present embodiment and a second embodiment to be described below, the configuration of the first light-emitting element 10 will be simplified and described. In a third embodiment to be described below, specific examples of the first light-emitting element 10 will be described in detail.

The first light-emitting element 10 has a top surface 10a, a bottom surface 10b opposite to the top surface 10a, and lateral surfaces 10c. The top surface 1a is a surface where the light reflecting layer 12 is disposed. The bottom surface 10b is in contact with the growth substrate 100. The lateral surfaces 10c are disposed between the top surface 1a and the bottom surface 10b. For example, the planar shapes of the top surface 1a and the bottom surface 10b are substantially rectangular, and the number of lateral surfaces 10c is 4. When viewed from a direction facing the lateral surface 10c, the first light-emitting element 10 has a substantially trapezoidal shape, and the bottom surface 10b is greater than the top surface 10a.

Figure 2:
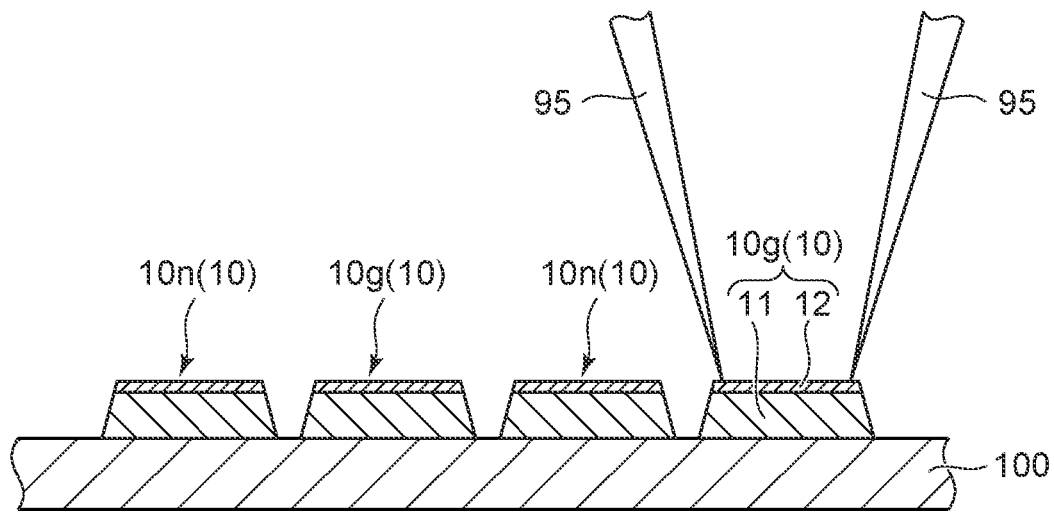
FIG. 2 is a cross-sectional view schematically illustrating the method for manufacturing the light-emitting device according to the first embodiment.

Determining whether First Light-Emitting Element 10 is Defective Product or Non-Defective Product Subsequently, as illustrated in FIG. 2, it is determined whether each of the plurality of first light-emitting elements 10 is a defective product or a non-defective product by appearance inspection and/or electrical characteristics evaluation on each of the plurality of first light-emitting elements 10. For example, in the electrical characteristics evaluation, a pair of probes 95 are brought into contact with the electrode layer of the first light-emitting element 10 and energized, and then the electrical characteristics of the first light-emitting element 10 are measured and evaluated. For example, a first light-emitting element 10 whose obtained characteristics do not satisfy a desired reference value is determined to be a defective product, and a first light-emitting element 10 whose obtained characteristics satisfy the reference value is determined to be a non-defective product. In FIG. 2, for convenience of explanation, the first light-emitting element 10 determined to be a defective product is denoted by reference numeral "10n", and the first light-emitting element 10 determined to be a non-defective product is denoted by a reference sign "10g". The same applies to the following diagrams. The first light-emitting elements 10n and 10g may also be collectively referred to as "first light-emitting elements 10".

Providing Stacked Body 99

Figure 3:
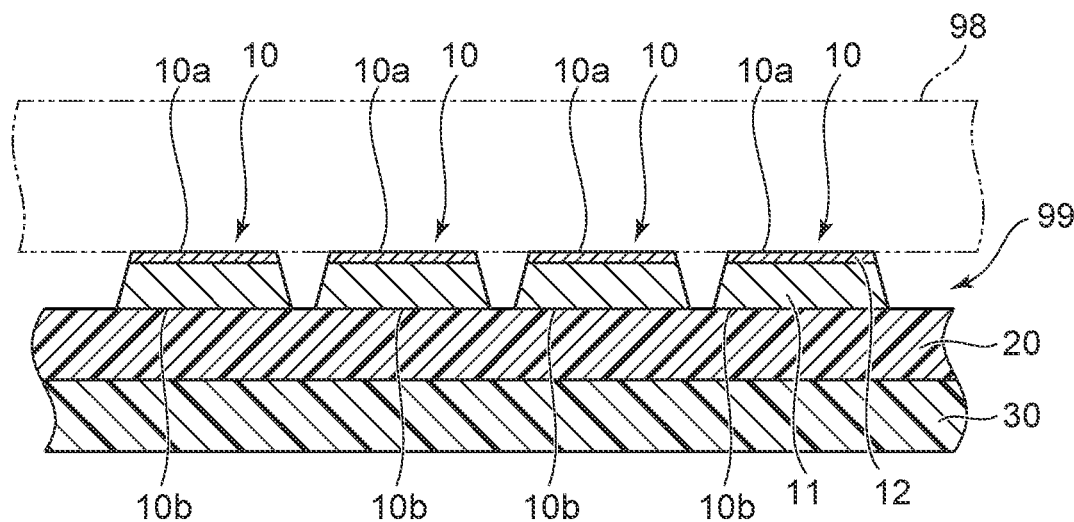
FIG. 3 is a cross-sectional view schematically illustrating the method for manufacturing the light-emitting device according to the first embodiment.

Subsequently, as illustrated in FIG. 3, a support substrate 98 is adhered to the top surfaces 10a of the plurality of corresponding first light-emitting elements 10. Subsequently, the growth substrate 100 is removed. This exposes the bottom surfaces 10b of the corresponding first light-emitting elements 10 from the growth substrate 100. Subsequently, a first ultraviolet transmitting layer 30 is adhered to the bottom surfaces 10b of the plurality of corresponding first light-emitting elements 10 via a first adhesive layer 20.

The first adhesive layer 20 is an ultraviolet reactive layer. The ultraviolet reactive layer is a layer whose adhesive force changes when irradiated with ultraviolet. For example, the ultraviolet reactive layer is formed of an ultraviolet curable resin and is cured when irradiated with ultraviolet, so that the adhesive force is reduced. The first ultraviolet transmitting layer 30 is a layer that substantially transmits ultraviolet and is a support for the first adhesive layer 20.

Subsequently, the support substrate 98 is removed. In this way, the plurality of first light-emitting elements 10 are transferred from the growth substrate 100 to the first ultraviolet transmitting layer 30, and thus the stacked body 99 is provided. In the stacked body 99, the first ultraviolet transmitting layer 30, the first adhesive layer 20, and the plurality of first light-emitting elements 10 are layered in this order.

Figure 4:
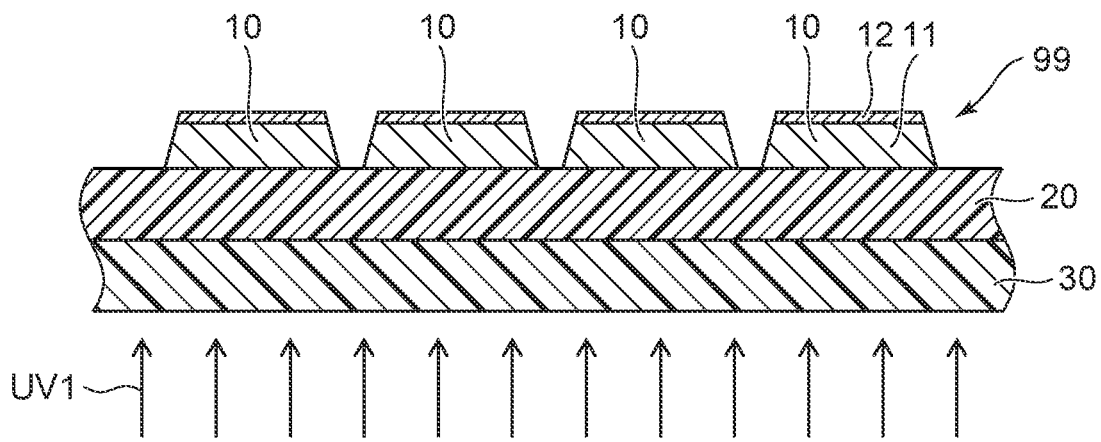
FIG. 4 is a cross-sectional view schematically illustrating the method for manufacturing the light-emitting device according to the first embodiment.

Subsequently, as illustrated in FIG. 4, the stacked body 99 is irradiated with ultraviolet UV1 from a direction facing the first ultraviolet transmitting layer 30. The ultraviolet UV1 passes through the first ultraviolet transmitting layer 30 and reaches the first adhesive layer 20, and the entire first adhesive layer 20 is irradiated with the ultraviolet UV1. This results in weak adhesion of the first adhesive layer 20 in the stacked body 99.

Providing Intermediate Body 90

Figure 5:
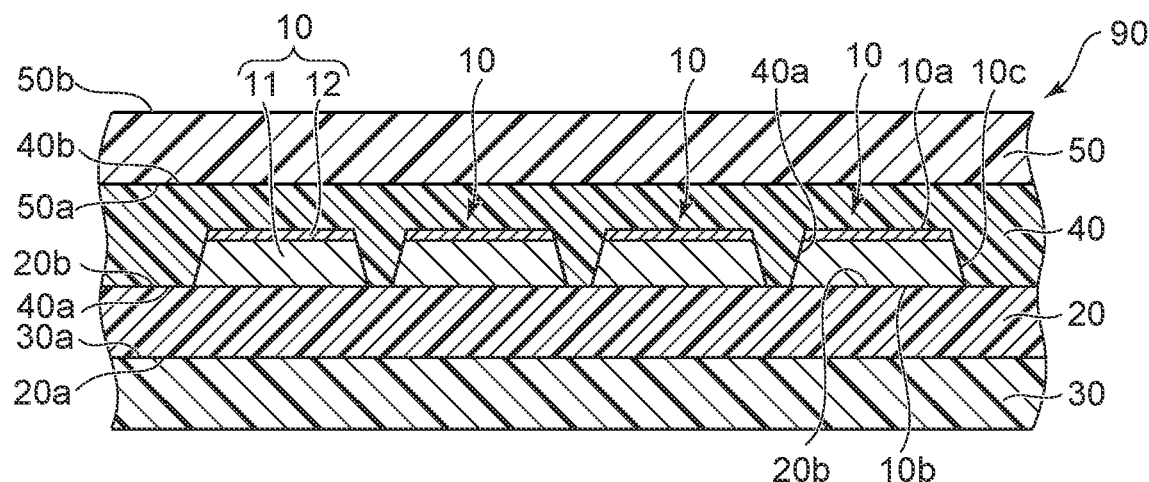
FIG. 5 is a cross-sectional view schematically illustrating the method for manufacturing the light-emitting device according to the first embodiment.

Subsequently, as illustrated in FIG. 5, a second ultraviolet transmitting layer 50 is disposed on the first adhesive layer 20 and on the first light-emitting elements 10 in the stacked body 99 via a second adhesive layer 40. For adhesion between the second adhesive layer 40 and the first light-emitting elements 10, for example, a vacuum mounter is used. As a result, the second adhesive layer 40, the first adhesive layer 20, and the first light-emitting elements 10 can be closely adhered to one another so that air bubbles do not enter among the second adhesive layer 40, the first adhesive layer 20, and the first light-emitting elements 10. That is, by using the vacuum mounter, the second adhesive layer 40 can be disposed between the lateral surfaces 10c of adjacent first light-emitting elements 10. The second ultraviolet transmitting layer 50 is a layer that substantially transmits ultraviolet and is a support for the second adhesive layer 40. The second ultraviolet transmitting layer 50 is adhered to the first adhesive layer 20 and the plurality of first light-emitting elements 10 by the second adhesive layer 40. At this time, the adhesive force of the second adhesive layer 40 is greater than the adhesive force of the first adhesive layer 20. The second adhesive layer 40 is, for example, an ultraviolet reactive layer of a type different from that of the first adhesive layer 20.

In this way, the intermediate body 90 is provided. The intermediate body 90 includes the first ultraviolet transmitting layer 30 having a first surface 30a, the first adhesive layer 20 having a second surface 20a in contact with the first surface 30a of the first ultraviolet transmitting layer 30 and a third surface 20b located opposite to the second surface 20a, the plurality of first light-emitting elements 10 in contact with the third surface 20b of the first adhesive layer 20 and each including the light reflecting layer 12 located on a side opposite to a side facing the third surface 20b, the second adhesive layer 40 having a fourth surface 40a in contact with the plurality of first light-emitting elements 10 and a fifth surface 40b located opposite to the fourth surface 40a, and the second ultraviolet transmitting layer 50 having a sixth surface 50a in contact with the fifth surface 40b of the second adhesive layer 40 and a seventh surface 50b located opposite to the sixth surface 50a.

In other words, in the intermediate body 90, the first ultraviolet transmitting layer 30, the first adhesive layer 20, the plurality of first light-emitting elements 10, the second adhesive layer 40, and the second ultraviolet transmitting layer 50 are layered in this order. The first surface 30a is a top surface of the first ultraviolet transmitting layer 30, the second surface 20a is a bottom surface of the first adhesive layer 20, the third surface 20b is a top surface of the first adhesive layer 20, the fourth surface 40a is a bottom surface of the second adhesive layer 40, the fifth surface 40b is a top surface of the second adhesive layer 40, the sixth surface 50a is a bottom surface of the second ultraviolet transmitting layer 50, and the seventh surface 50b is a top surface of the second ultraviolet transmitting layer 50. Note that the expression of "top surface" and "bottom surface" is for convenience and is independent of the direction of gravity.

The bottom surface 10b of the first light-emitting element 10 is in contact with the third surface 20b of the first adhesive layer 20, and the lateral surface 10c and the top surface 10a of the first light-emitting element 10 are in contact with the fourth surface 40a of the second adhesive layer 40. The bottom surface 10b of the first light-emitting element 10 located proximate to the first adhesive layer 20 is greater than the top surface 10a of the first light-emitting element 10 located proximate to the second adhesive layer 40.

Disposing Ultraviolet Shielding Layer 60

Figure 6:
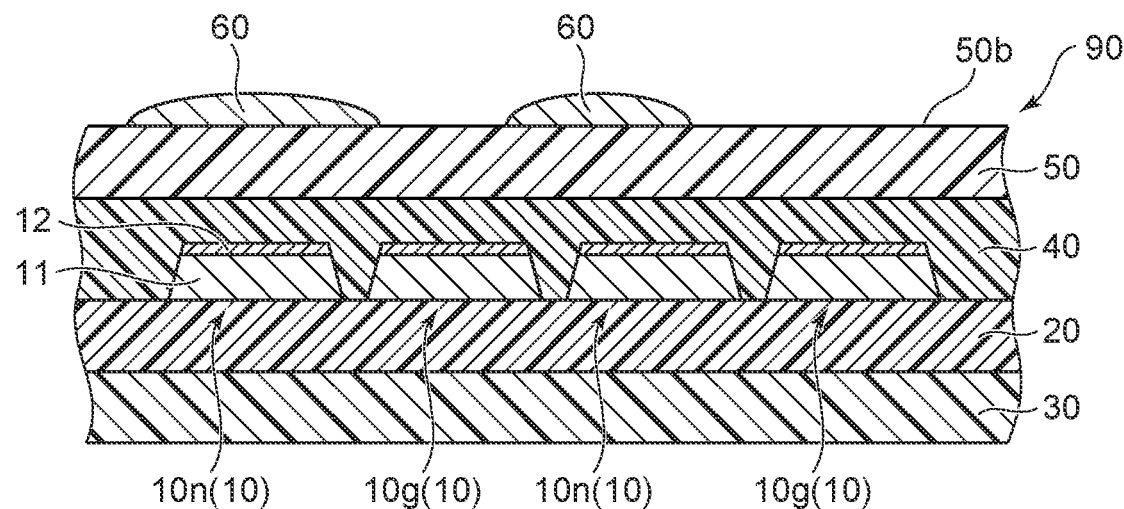
FIG. 6 is a cross-sectional view schematically illustrating the method for manufacturing the light-emitting device according to the first embodiment.

Subsequently, as illustrated in FIG. 6, the ultraviolet shielding layer 60 is disposed in a region, which corresponds to a part of the first light-emitting elements 10 (a region at least partially overlapping the part of the first light-emitting elements 10 in the top view), on the seventh surface 50b of the second ultraviolet transmitting layer 50. "The part of the first light-emitting elements 10" is, for example, at least one first light-emitting element 10n determined to be a defective product in the step illustrated in FIG. 2.

The ultraviolet shielding layer 60 is formed of a material that can shield ultraviolet by reflection, absorption, or the like. Examples of the ultraviolet shielding layer 60 include a metal oxide that shields ultraviolet such as titanium oxide and zinc oxide, resin containing a pigment that absorbs ultraviolet such as carbon, and a dielectric multilayer film or a metal film configured to shield ultraviolet. The ultraviolet shielding layer 60 can be disposed by, for example, coating, printing, or the like. In the step of disposing the ultraviolet shielding layer 60, a mask including the ultraviolet shielding layer 60 may be disposed on the seventh surface 50b of the second ultraviolet transmitting layer 50.

The ultraviolet shielding layer 60 is disposed, for example, in a region directly above each first light-emitting element 10n and is not disposed in a region directly above the first light-emitting element 10g. Note that when the plurality of first light-emitting elements 10 are densely disposed in the intermediate body 90, it is difficult to precisely allow the position of the ultraviolet shielding layer 60 to correspond only to the position of the first light-emitting element 10n. Therefore, an error inevitably occurs in the position of the ultraviolet shielding layer 60 relative to the first light-emitting element 10n in the step of disposing the ultraviolet shielding layer 60.

The ultraviolet shielding layer 60 shields at least a part of irradiated ultraviolet. The transmittance of ultraviolet in the ultraviolet shielding layer 60 is less than the transmittance of ultraviolet in the first ultraviolet transmitting layer 30 and the second ultraviolet transmitting layer 50 described above. For example, for ultraviolet having a wavelength of 365 nm, the transmittance of the first ultraviolet transmitting layer 30 is 50% or greater and the transmittance of the ultraviolet shielding layer 60 is 20% or less.

First Ultraviolet Irradiation

Figure 7:
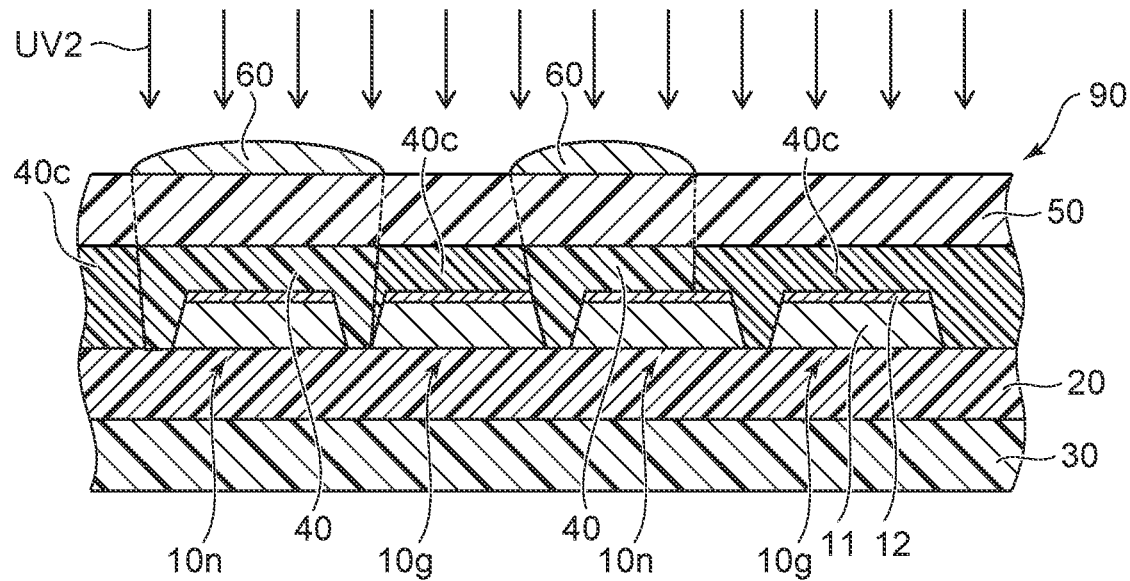
FIG. 7 is a cross-sectional view schematically illustrating the method for manufacturing the light-emitting device according to the first embodiment.

Subsequently, as illustrated in FIG. 7, the intermediate body 90 is irradiated with ultraviolet UV2 from a direction facing the ultraviolet shielding layer 60. The ultraviolet UV2 reached the ultraviolet shielding layer 60 is shielded by the ultraviolet shielding layer 60. The ultraviolet UV2 reached the second ultraviolet transmitting layer 50 by passing through the sides of the ultraviolet shielding layer 60 passes through the second ultraviolet transmitting layer 50 and is incident on the second adhesive layer 40. This results in a reduction of the adhesive force of a portion 40c of the second adhesive layer 40, which is irradiated with the ultraviolet UV2.

As described above, because the ultraviolet shielding layer 60 is disposed in a region corresponding to each first light-emitting element 10n, the portion 40c of the second adhesive layer 40 where the adhesive force is reduced is roughly a portion corresponding to the first light-emitting element 10g that is a non-defective product. However, because there is a high possibility that there is an error in the position of the ultraviolet shielding layer 60 relative to the first light-emitting element 10n, there is a high possibility that there is also an error in the positional relationship between the portion 40c and the first light-emitting element 10g. As a result, the first light-emitting element 10g is not always completely surrounded by the portion 40c, and the first light-emitting element 10g may come into contact with a portion of the second adhesive layer 40 where the adhesive force is not reduced.

Second Ultraviolet Irradiation

Figure 8:
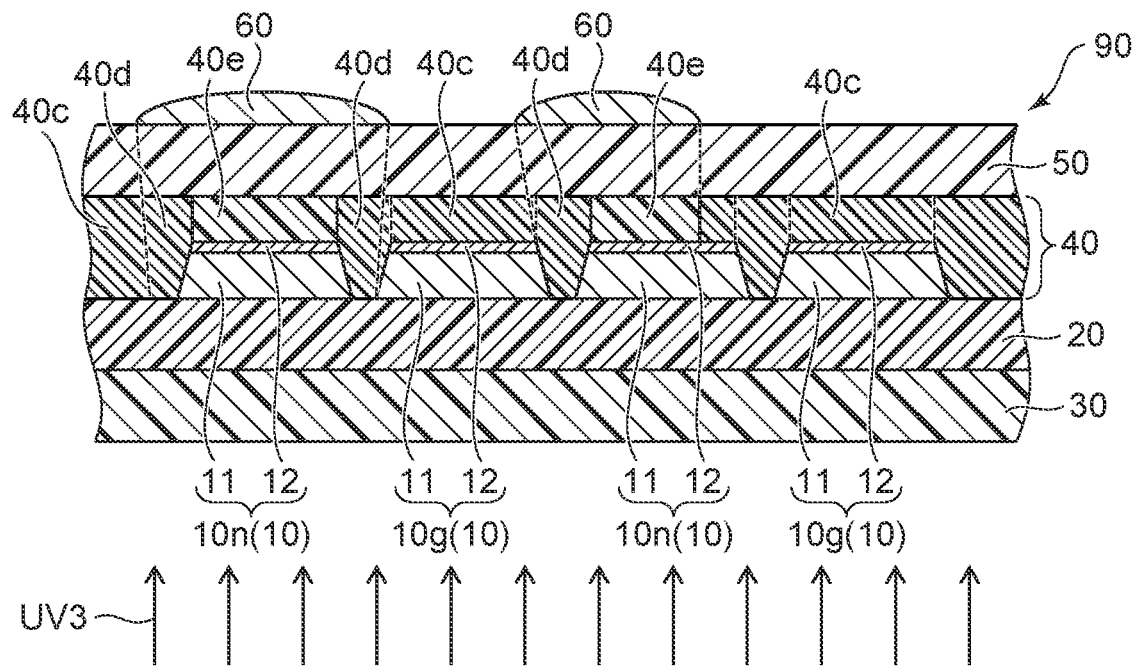
FIG. 8 is a cross-sectional view schematically illustrating the method for manufacturing the light-emitting device according to the first embodiment.

Subsequently, as illustrated in FIG. 8, the intermediate body 90 is irradiated with ultraviolet UV3 from a direction facing the first ultraviolet transmitting layer 30. The ultraviolet UV3 passes through the first ultraviolet transmitting layer 30 and the first adhesive layer 20 and is incident on the second adhesive layer 40 and the first light-emitting elements 10, but a part of the ultraviolet UV3 is shielded by the light reflecting layers 12 of the first light-emitting elements 10. As a result, the adhesive force of a portion 40d of the second adhesive layer 40, which is irradiated with the ultraviolet UV3, is reduced. The portion 40d is a portion of the second adhesive layer 40 located between the first light-emitting elements 10.

As a result, in the second adhesive layer 40, the adhesive force of the portion 40c irradiated with the ultraviolet UV2 in the first ultraviolet irradiation step and the adhesive force of the portion 40d irradiated with the ultraviolet UV3 in the second ultraviolet irradiation step are reduced, and the adhesive force of a portion 40e, which is neither the portion 40c nor the portion 40d, is maintained. At this stage, the adhesive forces of the portions 40c and 40d irradiated with the ultraviolet UV2 and UV3, respectively, in the second adhesive layer 40 are less than the adhesive force of the first adhesive layer 20, and the adhesive force of the portion 40e not irradiated with the ultraviolet UV2 and UV3 in the second adhesive layer 40 is greater than the adhesive force of the first adhesive layer 20.

The portion 40e is, for example, a region directly under the ultraviolet shielding layer 60 and is a portion located directly above the light reflecting layer 12 of the first light-emitting element 10. For that reason, the first light-emitting element 10n determined to be a defective product comes into contact with the portion 40e. On the other hand, the first light-emitting element 10g determined to be a non-defective product is surrounded by the portion 40c and the portion 40d and does not come into contact with the portion 40e.

Separating Part of First Light-Emitting Element 10n from First Adhesive Layer 20

Figure 9:
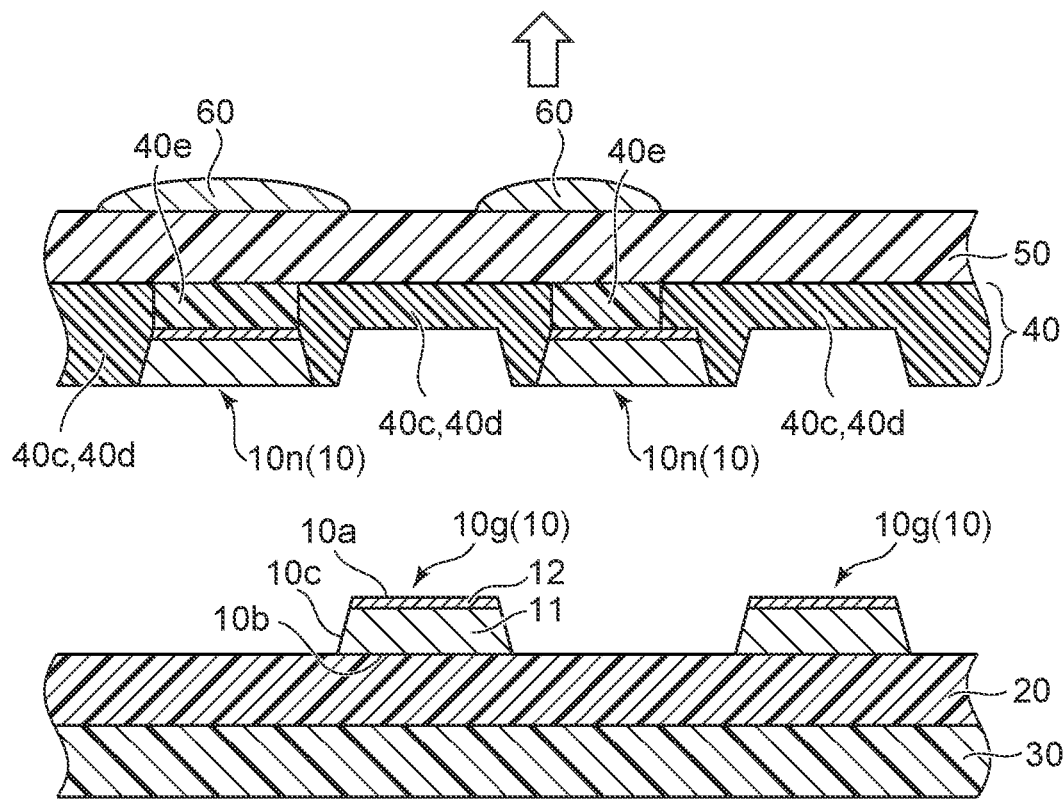
FIG. 9 is a cross-sectional view schematically illustrating the method for manufacturing the light-emitting device according to the first embodiment.

Subsequently, as illustrated in FIG. 9, the second ultraviolet transmitting layer 50 is peeled off from the first ultraviolet transmitting layer 30. As a result, the second adhesive layer 40 is separated from the first adhesive layer 20. At this time, whether the first light-emitting elements 10 are separated from the first adhesive layer 20 together with the second adhesive layer 40 or remain on the first adhesive layer 20 is determined by the strength relationship between the adhesive forces of the first adhesive layer 20 and the second adhesive layer 40. Because the adhesive force of the portion 40e of the second adhesive layer 40 is greater than the adhesive force of the first adhesive layer 20, the first light-emitting elements 10n in contact with the portion 40e are separated from the first adhesive layer 20 together with the second adhesive layer 40. On the other hand, because the adhesive forces of the portions 40c and 40d of the second adhesive layer 40 are less than the adhesive force of the first adhesive layer 20, the first light-emitting elements 10g not in contact with the portion 40e remain on the first adhesive layer 20.

Although surfaces other than the bottom surface 10b of the first light-emitting element 10 are covered by the second adhesive layer 40, the bottom surface 10b is greater than the top surface 10a, so that the first light-emitting element 10g can be easily separated from the second adhesive layer 40. In this way, only the first light-emitting element 10n determined to be a defective product can be removed from the first adhesive layer 20, and the first light-emitting element 10g determined to be a non-defective product can be left on the first adhesive layer 20.

Transferring to First Sheet 91

Figure 10:
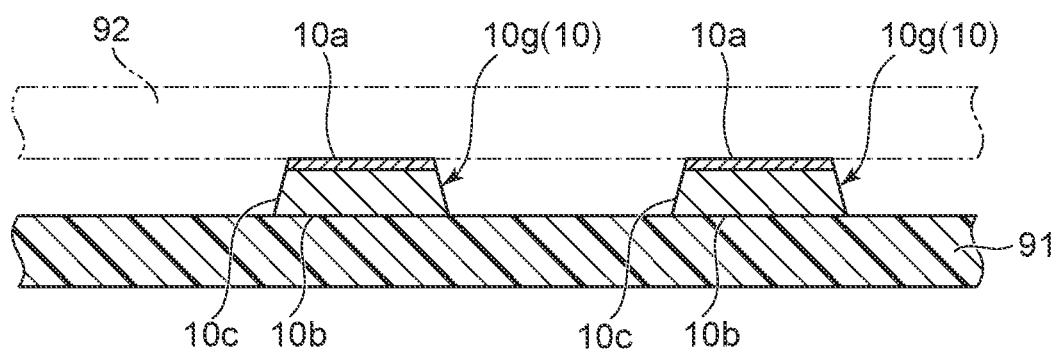
FIG. 10 is a cross-sectional view schematically illustrating the method for manufacturing the light-emitting device according to the first embodiment.

Subsequently, as illustrated in FIG. 10, the first light-emitting elements 10g remaining on the first adhesive layer 20 are transferred from the first adhesive layer 20 to the first sheet 91. The first sheet 91 is, for example, a heat-resistant sheet. In the present embodiment, the bottom surfaces 10b of the first light-emitting elements 10g are adhered to the first sheet 91.

For example, in the state illustrated in FIG. 9, a second sheet 92 is adhered to the top surfaces 10a of the corresponding first light-emitting elements 10g, and then the first ultraviolet transmitting layer 30 and the first adhesive layer 20 are removed. Subsequently, the first light-emitting elements 10g are transferred from the first adhesive layer 20 to the second sheet 92. Subsequently, the first sheet 91 is adhered to the bottom surfaces 10b of the corresponding first light-emitting elements 10g, and then the second sheet 92 is removed. In this way, the first light-emitting elements 10g can be transferred to the first sheet 91 in the state in which the bottom surfaces 10b of the corresponding first light-emitting elements 10g are in contact with the first sheet 91.

Disposing Second Light-Emitting Element 70

Figure 11:
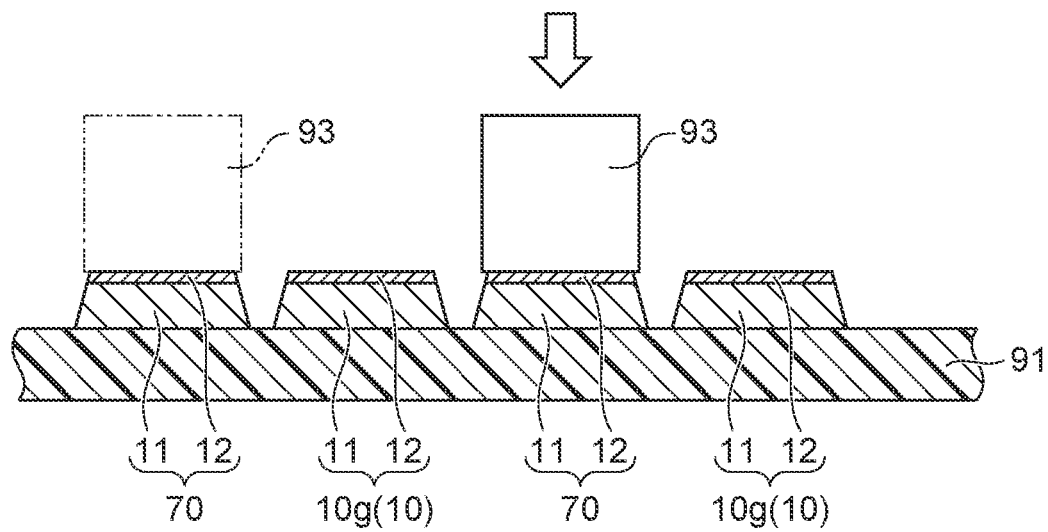
FIG. 11 is a cross-sectional view schematically illustrating the method for manufacturing the light-emitting device according to the first embodiment.

Subsequently, as illustrated in FIG. 11, for example, the second light-emitting element 70 is disposed in an empty region in the first sheet 91 (that is, a region where the first light-emitting element 10g is not disposed and where the first light-emitting element 10n in the intermediate body 90 has been separated) by using a mounter 93. The second light-emitting element 70 is, for example, a non-defective element of the same type as the first light-emitting element 10. The second light-emitting element 70 is also provided with the semiconductor portion 11 and the light reflecting layer 12, and the semiconductor portion 11 abuts against the first sheet 91. As a result, the second light-emitting element 70 is disposed in a region where the first light-emitting element 10n has been separated among the plurality of first light-emitting elements 10 disposed in a matrix form in the step illustrated in FIG. 3. In this way, the first light-emitting element 10n that is a defective product is replaced with the second light-emitting element 70 that is a non-defective product.

Transferring to Mounting Substrate

Figure 12:
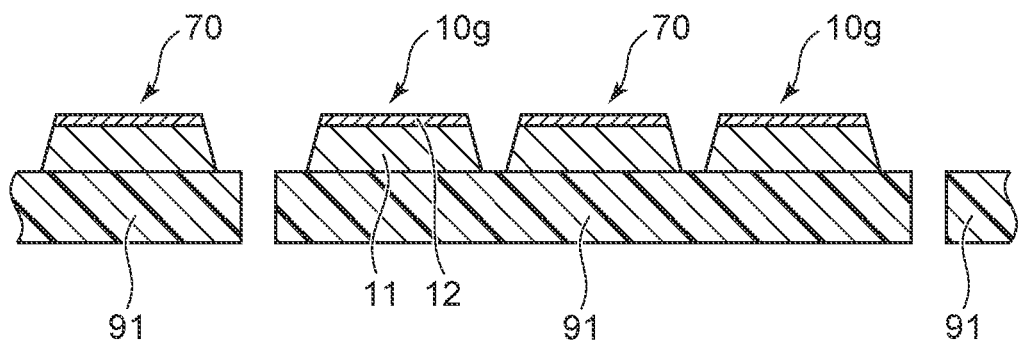
FIG. 12 is a cross-sectional view schematically illustrating the method for manufacturing the light-emitting device according to the first embodiment.

Subsequently, as illustrated in FIG. 12, the first sheet 91 is singulated according to the size of a light-emitting device to be manufactured. Each singulated first sheet 91 includes the first light-emitting element 10g and the second light-emitting element 70 to be mounted on one light-emitting device.

Figure 13:
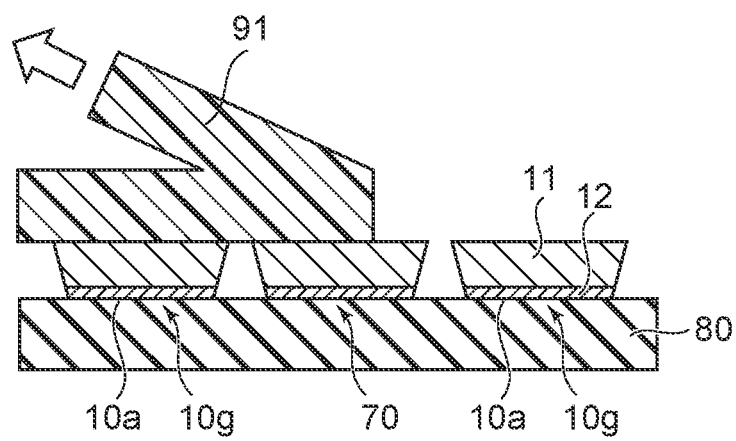
FIG. 13 is a cross-sectional view schematically illustrating the method for manufacturing the light-emitting device according to the first embodiment.

Subsequently, as illustrated in FIG. 13, the first light-emitting element 10g and the second light-emitting element 70 are transferred from the first sheet 91 to a mounting substrate 80. At this time, the top surface 10a of the first light-emitting element 10g and a top surface of the second light-emitting element 70 abut against the mounting substrate 80. Subsequently, the first sheet 91 is removed from the first light-emitting element 10g and the second light-emitting element 70.

Providing Covering Member

Figure 14:
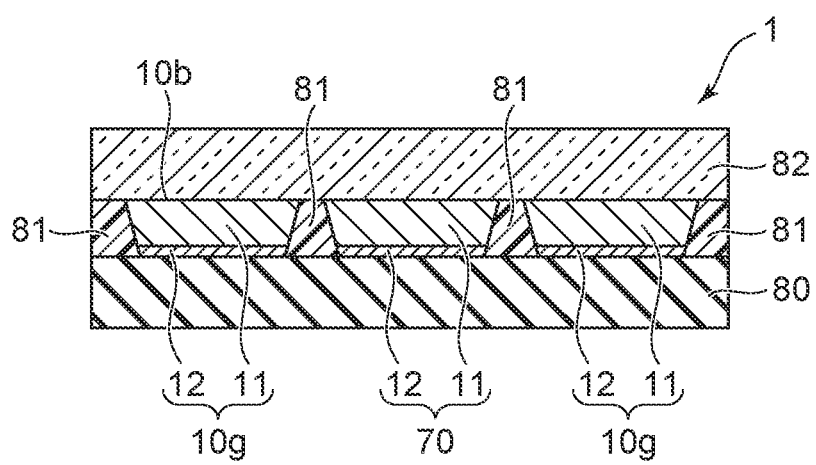
FIG. 14 is a cross-sectional view schematically illustrating the method for manufacturing the light-emitting device according to the first embodiment.

Subsequently, as illustrated in FIG. 14, a covering member 81 is disposed between the first light-emitting elements 10g, between the second light-emitting elements 70, and/or between the first light-emitting element 10g and the second light-emitting element 70. The covering member 81 may be disposed between the mounting substrate 80 and the first light-emitting element 10g and between the mounting substrate 80 and the second light-emitting element 70. The covering member 81 is an insulating member and is preferably a white resin.

Providing Light-Transmissive Member

Subsequently, a light-transmissive member 82 is disposed on the first light-emitting element 10g and on the second light-emitting element 70. For example, one light-transmissive member 82 is disposed with respect to one mounting substrate 80. The light-transmissive member 82 is adhered to the bottom surface 10b of the first light-emitting element 10g and a bottom surface of the second light-emitting element 70 via, for example, a glue layer. As a result, the light-transmissive member 82 covers the first light-emitting element 10g and the second light-emitting element 70. The light-transmissive member 82 includes, for example, a phosphor. In the light-transmissive member 82, for example, a large number of phosphor particles are disposed in a light-transmissive resin serving as a base material. In this way, the light-emitting device 1 according to the present embodiment is manufactured.

Light-Emitting Device 1

The configuration of the light-emitting device 1 will be described. As illustrated in FIG. 14, the light-emitting device 1 according to the present embodiment includes the mounting substrate 80, the first light-emitting elements 10g and/or the second light-emitting element 70, the covering member 81, and the light-transmissive member 82. The first light-emitting elements 10g and/or the second light-emitting element 70 are arranged, for example, in a matrix form on a top surface of the mounting substrate 80. The covering member 81 is disposed on the mounting substrate 80 between the first light-emitting elements 10g, between the second light-emitting elements 70, and/or between the first light-emitting element 10g and the second light-emitting element 70. The light-transmissive member 82 is disposed on the first light-emitting elements 10g and/or the second light-emitting element 70, and the covering member 81. The light reflecting layer 12 of the first light-emitting elements 10g and/or the second light-emitting element 70 includes a pair of electrode layers. The pair of electrode layers are each connected to a wiring line of the mounting substrate 80.

Next, an effect of the present embodiment will be described. In the present embodiment, in the step illustrated in FIG. 5, the plurality of first light-emitting elements 10 are sandwiched between the first adhesive layer 20 and the second adhesive layer 40, the bottom surface 10b of the first light-emitting element 10 is adhered to the first adhesive layer 20, and the top surface 10a of the first light-emitting element 10 is adhered to the second adhesive layer 40. At this time, the adhesive force of the second adhesive layer 40 is made greater than the adhesive force of the first adhesive layer 20. In the step illustrated in FIG. 6, the ultraviolet shielding layer 60 is disposed in the region corresponding to the first light-emitting element 10n that is a defective product, and in the step illustrated in FIG. 7, the ultraviolet UV2 is irradiated. As a result, the second adhesive layer 40 is selectively irradiated with the ultraviolet UV2, and the adhesive force of the portion 40c is reduced. The portion 40c is roughly disposed around the first light-emitting element 10g that is a non-defective product.

Subsequently, in the step illustrated in FIG. 8, the ultraviolet UV3 is irradiated. Because the ultraviolet UV3 is shielded by the light reflecting layer 12 of the first light-emitting element 10, the adhesive force of the portion 40d of the second adhesive layer 40 located around each of the first light-emitting elements 10 is reduced. As a result, even though there is an error in the position of the ultraviolet shielding layer 60, and a portion having a high adhesive force in the second adhesive layer 40 after the irradiation of the ultraviolet UV2 is in contact with the first light-emitting element 10g, the adhesive force of a portion of the second adhesive layer 40 disposed around the first light-emitting element 10 is reduced by the irradiation of the ultraviolet UV3. Accordingly, in the step illustrated in FIG. 9, the first light-emitting element 10g can be reliably left on the first adhesive layer 20. As described above, according to the present embodiment, even though the first light-emitting element 10 is miniaturized, the distance between the first light-emitting elements 10 is shortened, and it is difficult to expose the second adhesive layer 40 with high accuracy, only the first light-emitting element 10n that is a defective product can be accurately separated.

Note that in the present embodiment, the electrical characteristics of the first light-emitting element 10 are evaluated in the step illustrated in FIG. 2 to identify a non-defective product and a defective product, but the timing of evaluating the electrical characteristics of the first light-emitting element 10 is not limited thereto. However, the electrical characteristics of the first light-emitting element 10 is preferably evaluated when the electrode layer of the first light-emitting element 10 is exposed and is preferably evaluated before the step of providing the second adhesive layer 40 and the second ultraviolet transmitting layer 50 illustrated in FIG. 5.

The present embodiment has described an example in which the first light-emitting elements 10 are distinguished into a non-defective product and a defective product, and the defective product is removed from the first adhesive layer 20, but the present disclosure is not limited thereto. For example, any first light-emitting element 10 can be selected and replaced from a first light-emitting element group including the first light-emitting elements 10 classified into different standards.

Second Embodiment

Next, a second embodiment will be described.

FIGS. 15 to 18 are cross-sectional views illustrating a method for manufacturing a light-emitting device according to the present embodiment.

In the present embodiment, differences from the first embodiment will be mainly described, and the same parts as those of the first embodiment will be omitted.

First, the aforementioned steps illustrated in FIGS. 1 to 9 are performed. As a result, the first light-emitting elements 10n that are defective products are separated from the first adhesive layer 20 in which the plurality of first light-emitting elements 10 are disposed, so that a plurality of first light-emitting elements 10g that are defective products and remain on the first adhesive layer 20 are obtained.

Transferring to First Sheet

Figure 15:
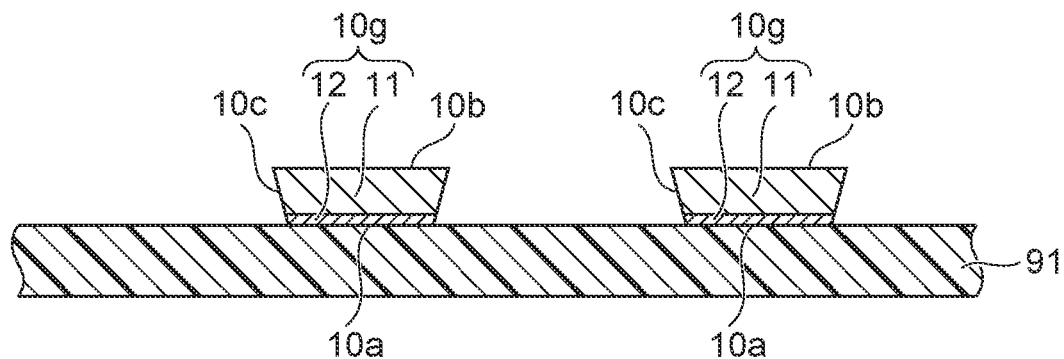
FIG. 15 is a cross-sectional view schematically illustrating a method for manufacturing a light-emitting device according to a second embodiment.

Subsequently, as illustrated in FIG. 15, the first light-emitting elements 10g remaining on the first adhesive layer 20 are transferred from the first adhesive layer 20 to the first sheet 91. In the present embodiment, unlike the first embodiment, the top surface 10a of the first light-emitting element 10g is adhered to the first sheet 91.

Disposing Second Light-Emitting Element 70

Figure 16:
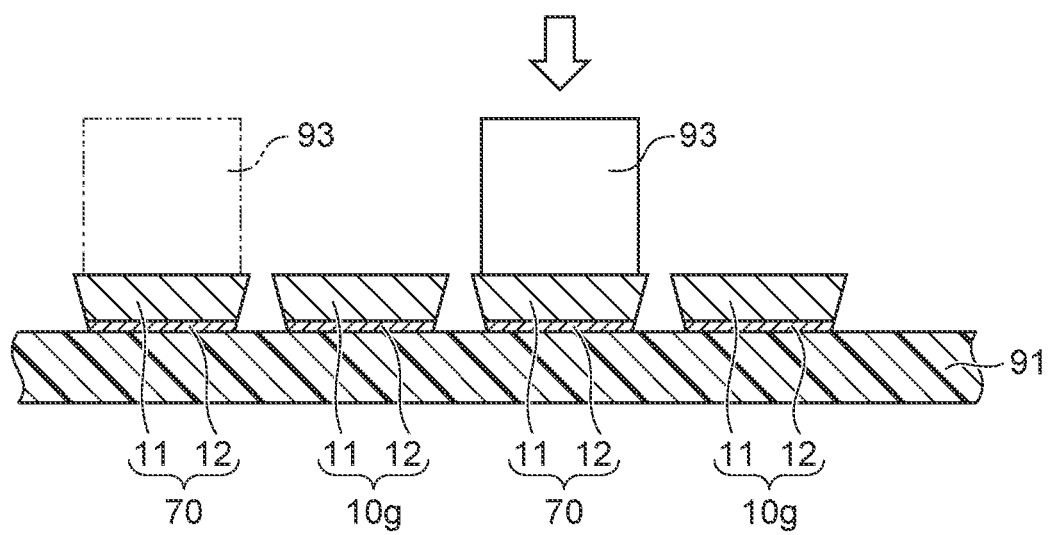
FIG. 16 is a cross-sectional view schematically illustrating the method for manufacturing the light-emitting device according to the second embodiment.

Subsequently, as illustrated in FIG. 16, for example, the second light-emitting element 70 is disposed in an empty region of the first sheet 91 by using the mounter 93. As a result, the second light-emitting element 70 is disposed in a region where the first light-emitting element 10n has been separated among the plurality of first light-emitting elements 10 disposed in a matrix form in the step illustrated in FIG. 3. Also in this case, unlike the first embodiment, the top surface of the second light-emitting element 70, that is, a surface of the light reflecting layer 12 is adhered to the first sheet 91.

Providing Light-Transmissive Member

Figure 17:
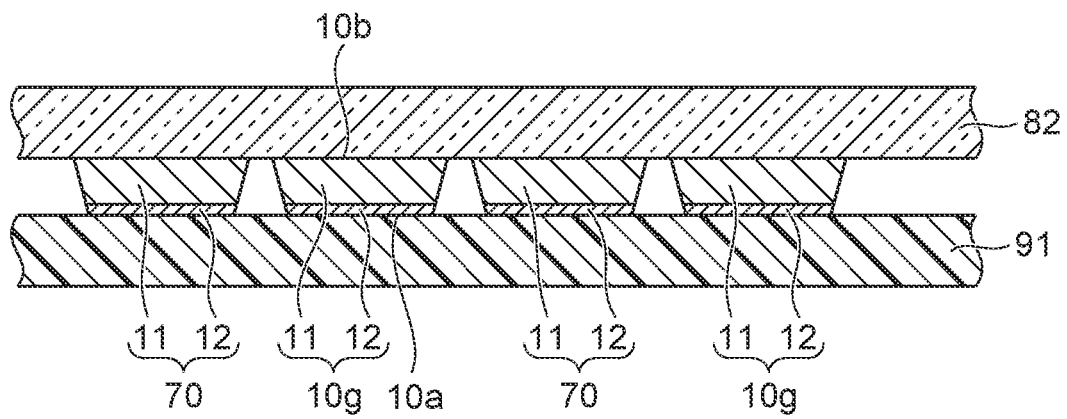
FIG. 17 is a cross-sectional view schematically illustrating the method for manufacturing the light-emitting device according to the second embodiment.

Subsequently, as illustrated in FIG. 17, the light-transmissive member 82 is disposed on the first light-emitting elements 10g and/or on the second light-emitting elements 70. The light-transmissive member 82 is adhered to the bottom surfaces 10b of the corresponding first light-emitting elements 10g and/or the bottom surfaces of the corresponding second light-emitting elements 70 via, for example, a glue layer. As a result, the light-transmissive member 82 covers the first light-emitting elements 10g and/or the second light-emitting elements 70.

Mounting on Mounting Substrate

Figure 18:
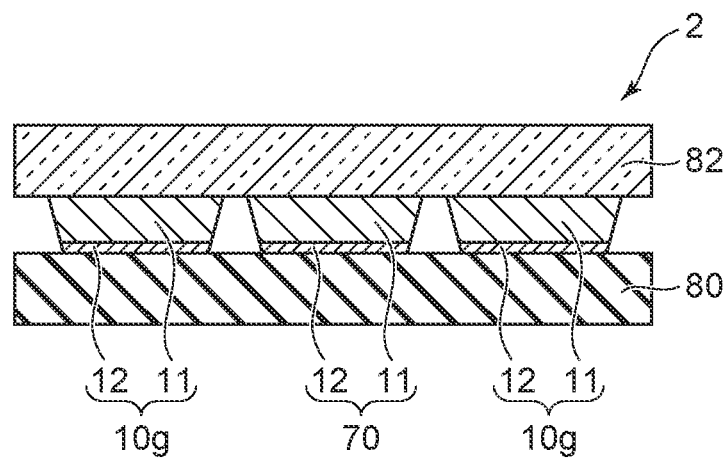
FIG. 18 is a cross-sectional view schematically illustrating the method for manufacturing the light-emitting device according to the second embodiment.

Subsequently, as illustrated in FIG. 18, the first sheet 91 is removed. Subsequently, the light-transmissive member 82 is singulated according to the size of a light-emitting device to be manufactured. Subsequently, a structure including the first light-emitting elements 10g and/or the second light-emitting elements 70, and the light-transmissive member 82 is disposed on the mounting substrate 80. In this way, a light-emitting device 2 according to the present embodiment is manufactured.

Note that after the light-transmissive member 82 is provided, the covering member 81 may be disposed between the first light-emitting elements 10g, between the second light-emitting elements 70, and/or between the first light-emitting element 10g and the second light-emitting element 70, and the covering member 81 may also be cut when the light-transmissive member 82 is singulated. After the structure including the first light-emitting elements 10g and/or the second light-emitting elements 70 and the light-transmissive member 82 is disposed on the mounting substrate 80, the light-transmissive member 82 and the mounting substrate 80 may be cut together.

Third Embodiment

A third embodiment is an example of manufacturing a light-emitting module by using the method for manufacturing a light-emitting device according to the first embodiment described above.

First, the configuration of a light-emitting module according to the present embodiment will be described.

Figure 19:
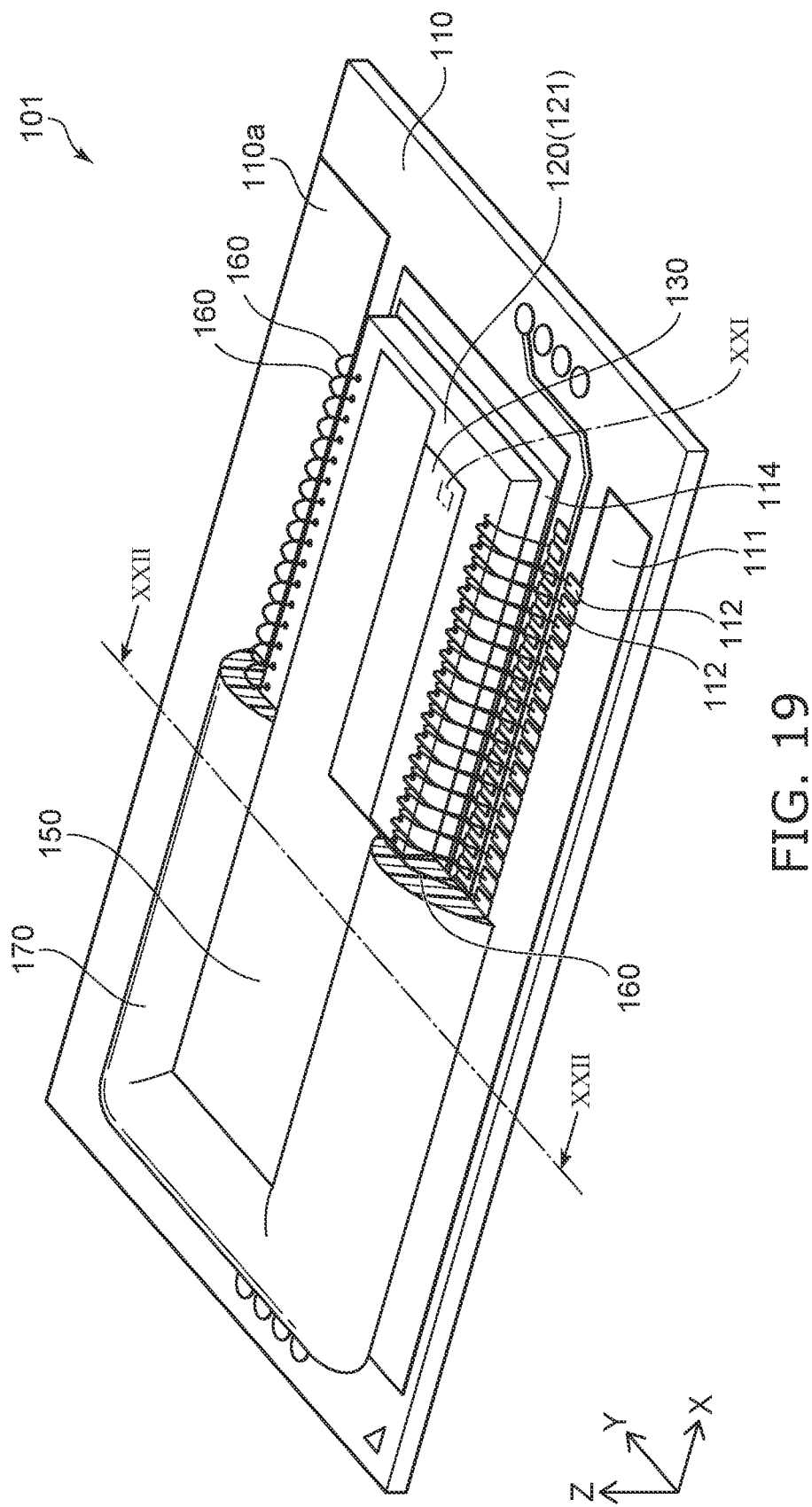
FIG. 19 is a perspective view schematically illustrating a light-emitting module according to a third embodiment when viewed from diagonally above.

FIG. 19 is a perspective view schematically illustrating the light-emitting module according to the present embodiment when viewed from diagonally above.

Figure 20:
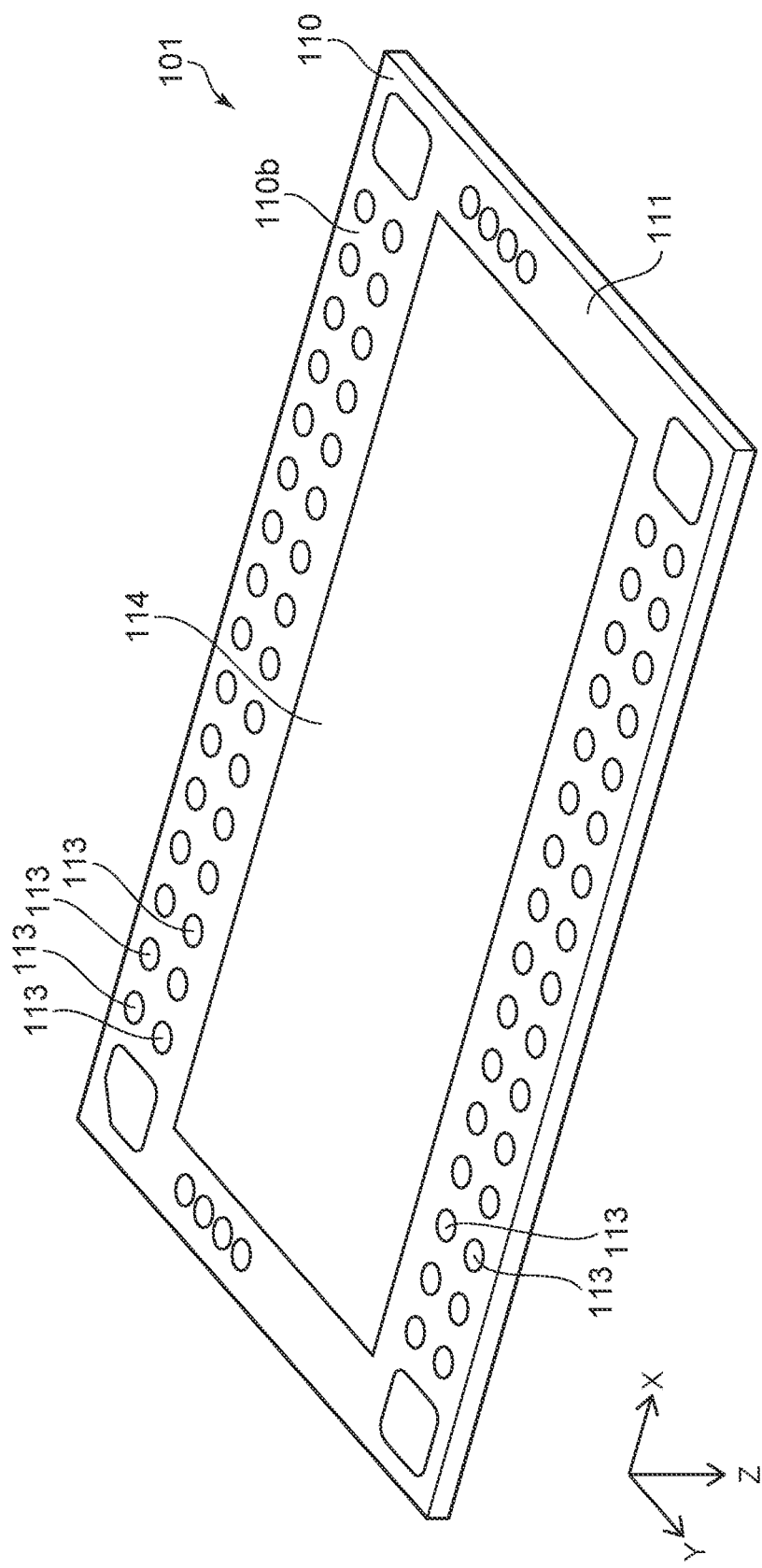
FIG. 20 is a perspective view schematically illustrating the light-emitting module according to the third embodiment when viewed from diagonally below.

FIG. 20 is a perspective view schematically illustrating the light-emitting module according to the present embodiment when viewed from diagonally below.

Figure 21:
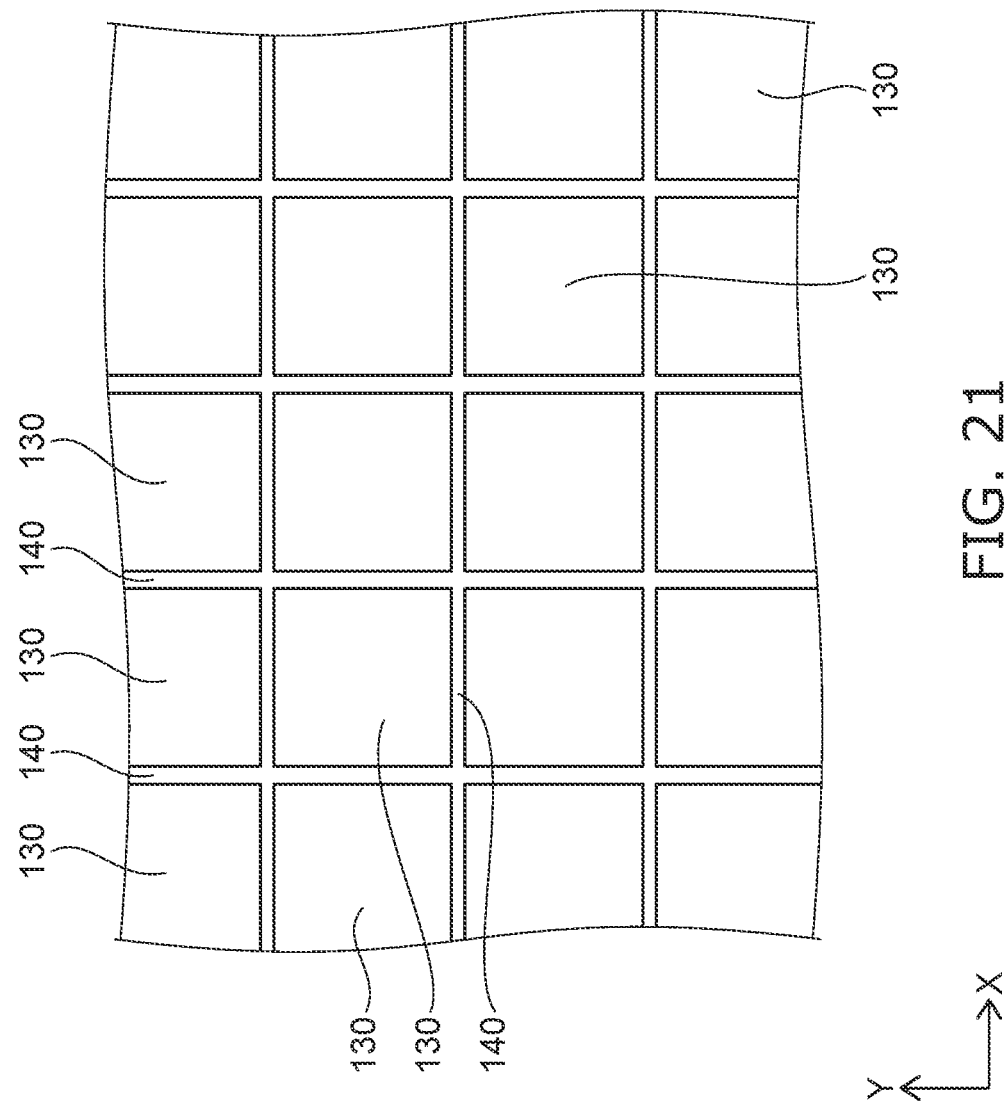
FIG. 21 is a partially enlarged top view illustrating a region XXI of FIG. 19.

FIG. 21 is a partially enlarged top view illustrating a region XXI of FIG. 19.

Figure 22:
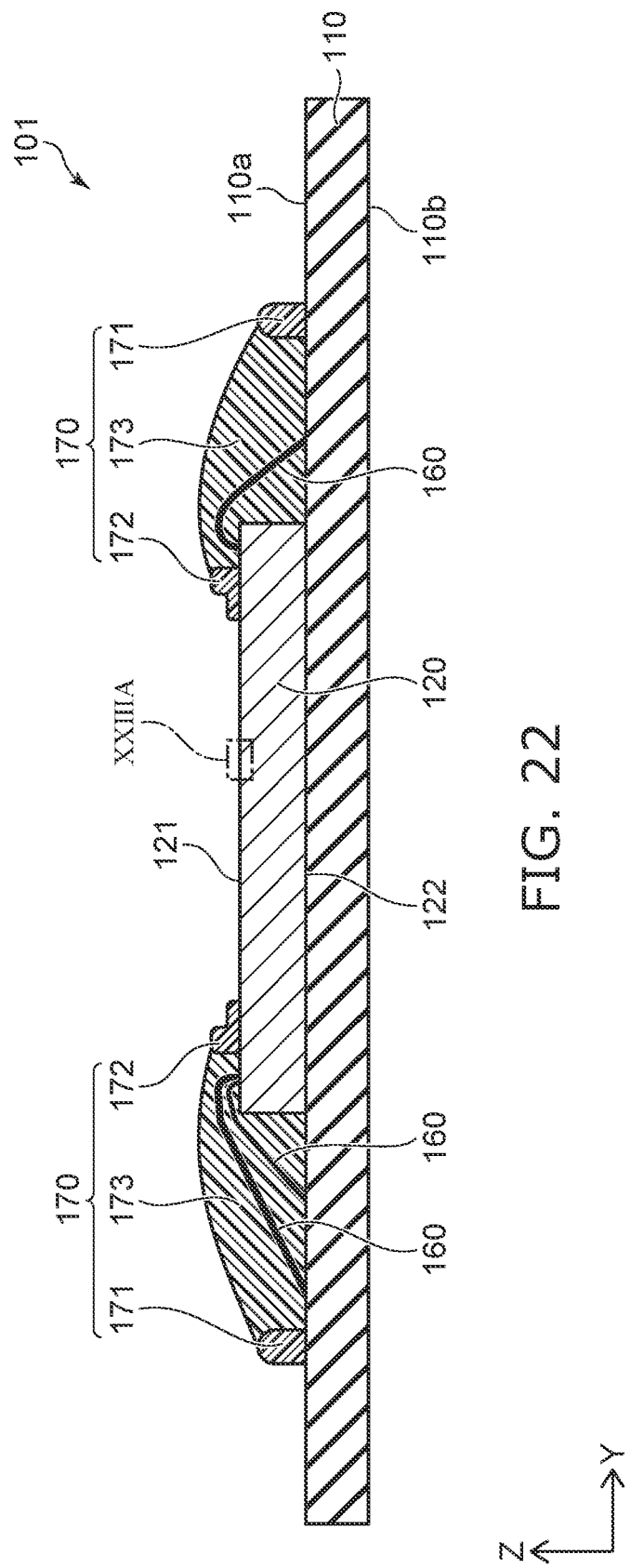
FIG. 22 is a cross-sectional view taken along line XXII-XXII illustrated in FIG. 19.

FIG. 22 is a cross-sectional view taken along line XXII-XXII illustrated in FIG. 19.

Figure 23A:
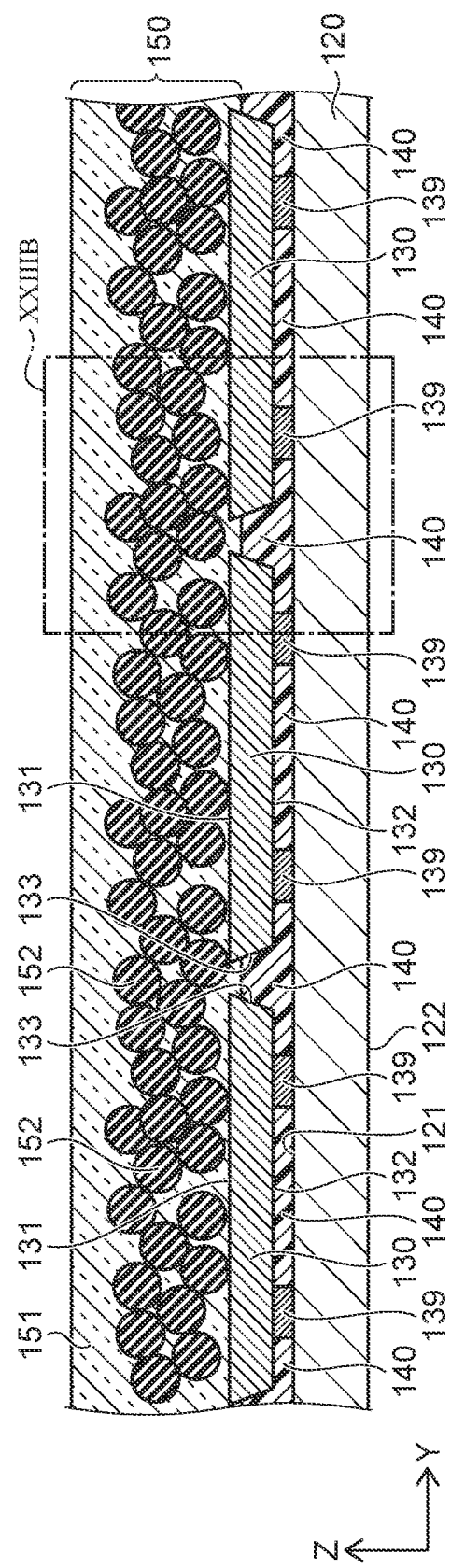
FIG. 23A is a partially enlarged cross-sectional view illustrating a region XXIIIA of FIG. 22.

FIG. 23A is a partially enlarged cross-sectional view illustrating a region XXIIIA of FIG. 22.

Figure 23B:
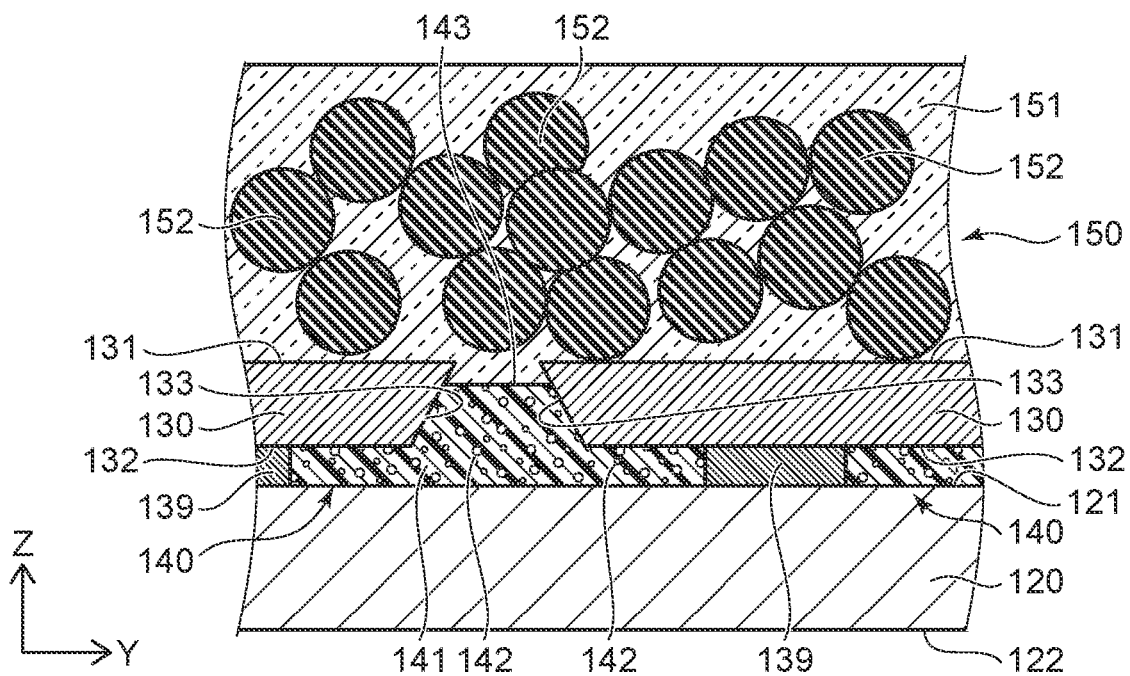
FIG. 23B is a partially enlarged cross-sectional view illustrating a region XXIIIB of FIG. 23A.

FIG. 23B is a partially enlarged cross-sectional view illustrating a region XXIIIB of FIG. 23A.

As illustrated in FIGS. 19 to 21, a light-emitting module 101 according to the present embodiment includes a package substrate 110, a wiring substrate 120, a plurality of light-emitting elements 130, a first resin 140, a second resin 150, a plurality of wires 160, and a third resin 170. Note that in FIG. 19, for convenience of illustration, a part of the third resin 170 and a part of the second resin 150 are omitted, and a part of the wire 160 and a part of the light-emitting elements 130 are visualized.

The package substrate 110 has, for example, a rectangular shape in a plan view. The package substrate 110 includes, for example, an insulating base 111 such as ceramics or resin. A plurality of wiring lines are formed inside the insulating base 111 by, for example, a conductive material such as copper (Cu). Some of the wiring lines are exposed to a top surface 110a of the package substrate 110 and serve as a plurality of first pads 112, and others of the wiring lines are exposed to a bottom surface 110b of the package substrate 110 and serve as a plurality of second pads 113.

In the present embodiment, an XYZ Cartesian coordinate system is employed for convenience of explanation. It is assumed that a longer direction of the package substrate 110 is an "X direction", a shorter direction of the package substrate 110 is a "Y direction", and the thickness direction is a "Z direction". In the "Z direction", a direction from the bottom surface 110b to the top surface 110a of the package substrate 110 is also referred to as "upper", and an opposite direction is also referred to as "lower", but this expression is also for convenience and is independent of the direction of gravity.

A heat dissipating section 114 made of a heat conductive material, for example, copper, is exposed on the top surface 110a and the bottom surface 110b of the package substrate 110. As the heat dissipating section 114, for example, a material having excellent thermal conductivity such as aluminum or copper can be used. In the plan view, the heat dissipating section 114 is disposed in the central portion of the package substrate 110. The first pads 112 and the second pads 113 are disposed on both sides of the heat dissipating section 114 in the Y direction. The first pads 112 and the second pads 113 are arranged along long sides of the package substrate 110, for example.

The wiring substrate 120 is disposed on the heat dissipating section 114 of the package substrate 110. The wiring substrate 120 is, for example, a silicon substrate having an integrated circuit therein and is, for example, an Application Specific Integrated Circuit (ASIC) substrate. A bottom surface of the wiring substrate 120 is bonded to a top surface of the heat dissipating section 114 via, for example, a bonding member. As the bonding member, for example, a silicone silver paste is used. Pads to be connected to the light-emitting elements 130 are disposed in the central portion of a top surface 121 of the wiring substrate 120. External connection pads are disposed around the pads to be connected to the light-emitting elements 130.

Wires 160 are connected to the first pads 112 of the package substrate 110 and the external connection pads of the wiring substrate 120. The wire 160 is, for example, gold (Au). For example, the number of wires 160 is the same as the number of first pads 112.

In the plan view, the third resin 170 has a rectangular frame shape along an outer edge of the wiring substrate 120. The third resin 170 is disposed on the top surface of the package substrate 110 and the top surface of the wiring substrate 120 and covers the first pads 112 of the package substrate 110, the wires 160, and the external connection pads of the wiring substrate 120. In the plan view, the third resin 170 has a frame shape with an opening in the central portion thereof and does not cover the plurality of light-emitting elements 130, the first resin 140, and the second resin 150.

As illustrated in FIG. 22, the third resin 170 includes a first resin frame 171 forming an outer frame of the third resin 170, a second resin frame 172 forming an inner frame of the third resin 170, and a protective resin 173 disposed between the first resin frame 171 and the second resin frame 172. The first resin frame 171 is disposed on the package substrate 110. The second resin frame 172 is disposed on the wiring substrate 120. The protective resin 173 continuously covers the top surface of the package substrate 110, the top surface of the wiring substrate 120, and surfaces of the wires 160. The first resin frame 171 and the second resin frame 172 are, for example, light-transmissive resins. In the protective resin 173, for example, a light-reflective material is contained in a light-transmissive resin serving as a base material. As the light-transmissive resin, for example, a dimethyl silicone resin can be used. The light-reflective material is, for example, titanium oxide or aluminum oxide.

As illustrated in FIGS. 19, 21, and 22, the plurality of light-emitting elements 130 are placed on a central portion of the top surface 121 of the wiring substrate 120. The plurality of light-emitting elements 130 are arranged in a matrix form, for example. In an example, because there are four segments each in which the light-emitting elements 130 are disposed in 64 rows and 64 columns, a total of 16384 light-emitting elements 130 are disposed. In an example, the size of each light-emitting element 130 is in a range from 40 µm to 50 µm. In an example, the distance between adjacent light-emitting elements 130 is in a range from 4 µm to 8 µm. The light-emitting elements 130 are connected to the corresponding pads exposed on the top surface 121 of the wiring substrate 120. The light-emitting element 130 is, for example, a light-emitting diode and emits, for example, blue light.

As illustrated in FIG. 23A, the light-emitting element 130 has a top surface 131, a bottom surface 132 opposite to the top surface 131, and lateral surfaces 133 disposed between the top surface 131 and the bottom surface 132. Each of the lateral surfaces 133 is inclined to expand from the bottom surface 132 toward the top surface 131. The lateral surfaces 133 are disposed on four sides. The bottom surface 132 of the light-emitting element 130 faces the top surface 121 of the wiring substrate 120. The light-emitting element 130 is connected to pads of the wiring substrate 120 via a pair of bonding sections 139. For that reason, the bottom surface 132 of the light-emitting element 130 is separated from the top surface 121 of the wiring substrate 120. The bonding section 139 is, for example, gold or copper.

The first resin 140 is disposed between the top surface 121 of the wiring substrate 120 and the bottom surface 132 of the light-emitting element 130, and between the lateral surfaces 133 of adjacent light-emitting elements 130. In the first resin 140, light-reflective materials 142 are contained in a base material 141. The concentration of the light-reflective material 142 in the first resin 140 is preferably in a range from 50 mass % to 70 mass % and is, for example, 60 mass %. The base material 141 is, for example, a dimethyl silicone resin. The light-reflective material 142 is, for example, titanium oxide.

The second resin 150 covers the top surface 131 of the light-emitting element 130 and a top surface 143 of the first resin 140. The second resin 150 is in contact with the top surface 131 of the light-emitting element 130, an upper portion of the lateral surface 133, and the top surface 143 of the first resin 140. In the second resin 150, phosphors 152 are contained in a base material 151. The base material 151 is, for example, a dimethyl silicone resin. The phosphor 152 contains, for example, Yttrium Aluminum Garnet (YAG), absorbs blue light from the light-emitting element 130, and emits yellow light.

As illustrated in FIG. 23B, between adjacent light-emitting elements 130, the top surface 143 of the first resin 140 is located between the top surface 131 and the bottom surface 132 of the light-emitting element 130 in the Z direction, that is, in the direction from the wiring substrate 120 toward the second resin 150. As a result, a lower portion of the lateral surface 133 of the light-emitting element 130 is covered by the first resin 140, and an upper portion thereof is covered by the second resin 150.

The wiring substrate 120 of the present embodiment corresponds to the mounting substrate 80 of the first embodiment. The light-emitting element 130 of the present embodiment corresponds to the first light-emitting element 10g and the second light-emitting element 70 of the first embodiment. The top surface 131, the bottom surface 132, and the lateral surfaces 133 of the light-emitting element 130 of the present embodiment correspond to the bottom surface 10b, the top surface 10a, and the lateral surfaces 10c of the first light-emitting element 10 of the first embodiment, respectively. The first resin 140 of the present embodiment corresponds to the covering member 81 of the first embodiment. The second resin 150 of the present embodiment corresponds to the light-transmissive member 82 of the first embodiment.

Figure 24:
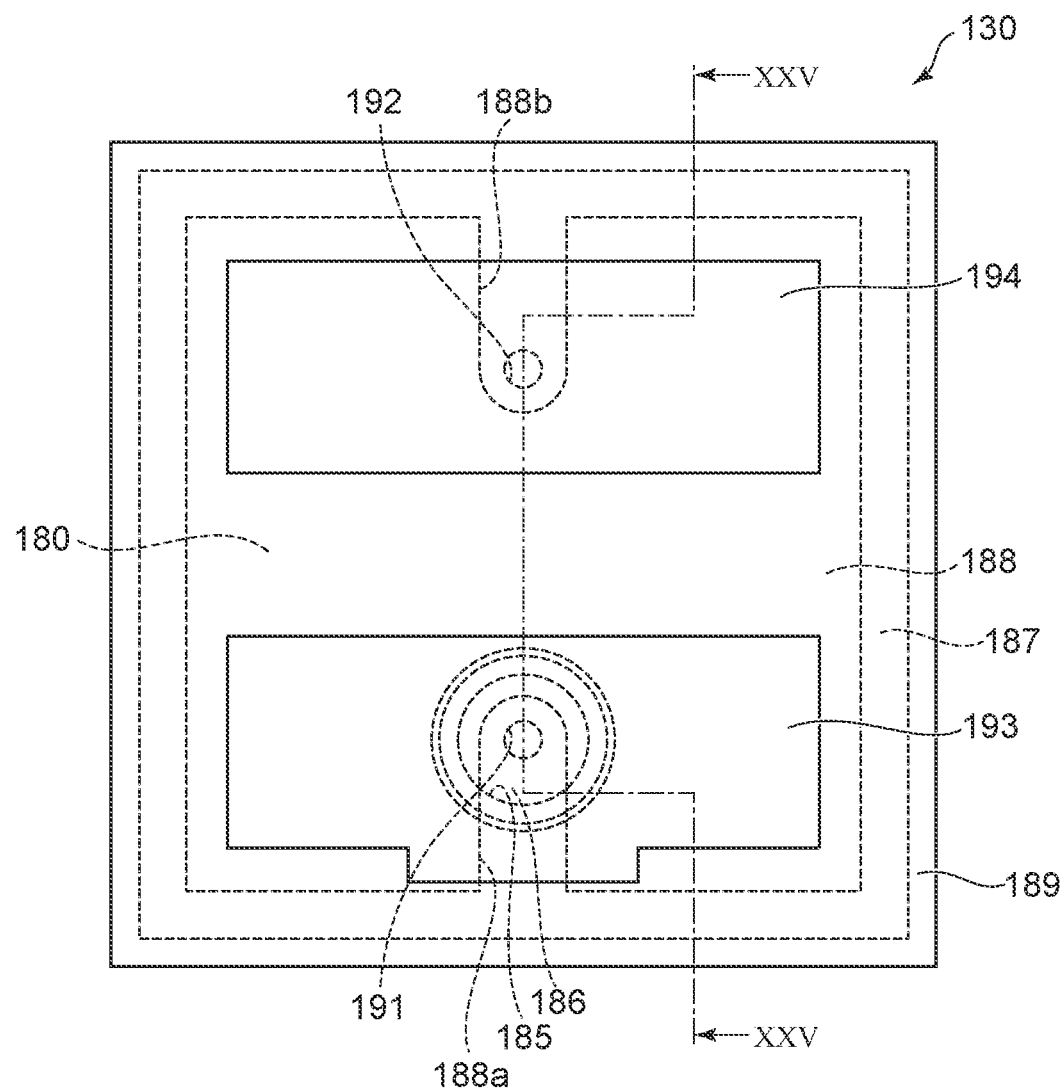
FIG. 24 is a top view schematically illustrating a light-emitting element in the third embodiment.
Figure 25:
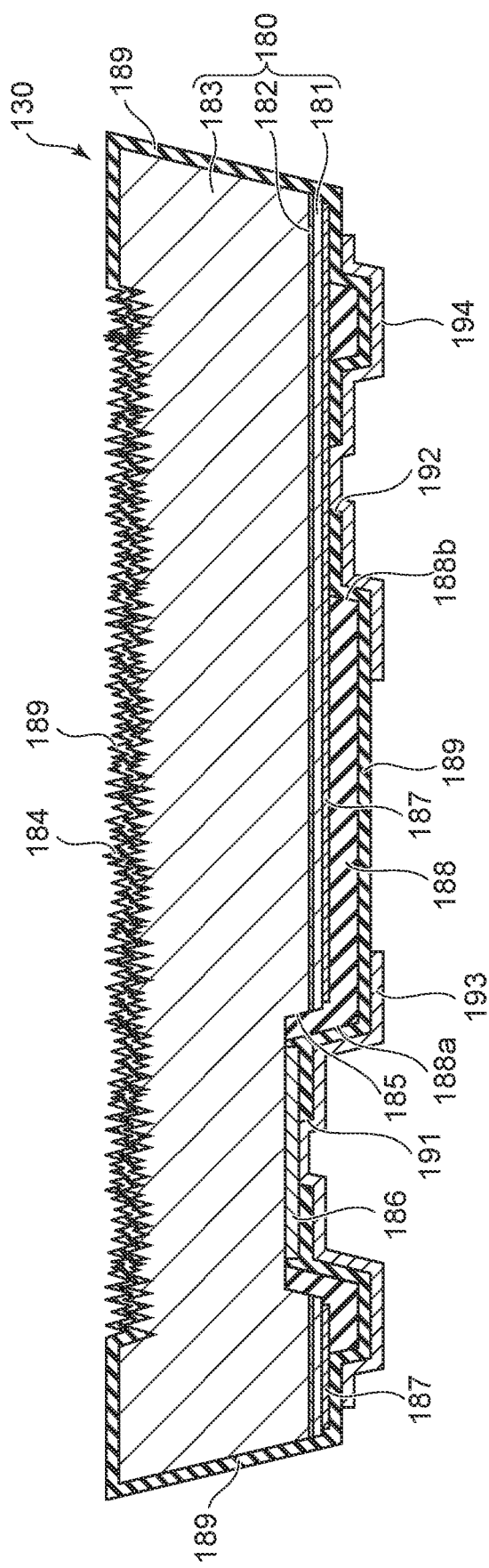
FIG. 25 is a cross-sectional view taken along line XXV-XXV illustrated in FIG. 24.

Next, the configuration of the light-emitting element 130 will be described. FIG. 24 is a top view illustrating the light-emitting element in the present embodiment. FIG. 25 is a cross-sectional view taken along line XXV-XXV illustrated in FIG. 24.

As illustrated in FIGS. 24 and 25, a semiconductor portion 180 is disposed in the light-emitting element 130. The semiconductor portion 180 contains, for example, gallium nitride (GaN). In the semiconductor portion 180, a p-type layer 181, a light-emitting layer 182, and an n-type layer 183 are layered in this order from the bottom to the top. The p-type layer 181 includes a semiconductor layer including p-type impurities. As the p-type impurity, for example, magnesium (Mg) is used. The n-type layer 183 includes a semiconductor layer including n-type impurities. As the n-type impurity, for example, silicon (Si) is used.

A plurality of protrusions 184 are formed on a top surface of the n-type layer 183 of the semiconductor portion 180.

A hole 185 is formed on a bottom surface of the p-type layer 181 of the semiconductor portion 180. The hole 185 passes through the p-type layer 181 and the light-emitting layer 182 from a bottom surface of the p-type layer 181 and reaches the middle of the n-type layer 183. In a plan view, the hole 185 has, for example, a circular shape. An n electrode 186 is disposed on a bottom surface of the hole 185. The n electrodes 186 is electrically connected to n-type layer 183.

The n electrode 186 is, for example, a layered structure in which a plurality of metal layers are layered. The n electrode 186 may be, for example, a layered structure in which a titanium (Ti) layer, an aluminum-copper (AlCu) layer, the Ti layer, and a ruthenium (Ru) layer are layered in order from the layer proximate to the n-type layer 183. In the above layered structure, for example, the thickness of the Ti layer that is the first layer can be set to 1.2 nm, the thickness of the AlCu layer that is the second layer can be set to 200 nm, the thickness of the Ti layer that is the third layer can be set to 150 nm, and the thickness of the Ru layer that is the fourth layer can be set to 100 nm. A p electrode 187 is disposed in a region on the bottom surface of the p-type layer 181 excluding the hole 185. The p electrode 187 is electrically connected to the p-type layer 181. The p electrode 187 has transmissivity and is, for example, Indium-Tin-Oxide (ITO). The thickness of the p electrode 187 is in a range from 150 nm to 300 nm, for example.

A light reflecting layer 188 is disposed on the bottom surface of the semiconductor portion 180 to cover a part of the p electrode 187. In the plan view, the light reflecting layer 188 has a substantially rectangular shape, and two recesses 188a and 188b extending inward from each of two opposing sides are disposed. In the plan view, the recess 188a reaches the hole 185, and the bottom surface of the hole 185 exposes through the recess 188a. The light reflecting layer 188 also covers a lateral surface of the hole 185. The light reflecting layer 188 may include, for example, a dielectric multilayer film in which a plurality of dielectrics are layered.

An insulating layer 189 is disposed on the surface of the semiconductor portion 180. On the bottom surface of the semiconductor portion 180, openings 191 and 192 are formed in the insulating layer 189. The opening 191 is located in the recess 188a of the light reflecting layer 188 and is located in the central portion of the bottom surface of the hole 185. The opening 192 is located in the recess 188b of the light reflecting layer 188. The insulating layer 189 covers a part of the p electrode 187 and a part of the light reflecting layer 188. The insulating layer 189 is, for example, $SiO_2$. The thickness of the insulating layer 189 is, for example, 400 nm in a region covering the plurality of protrusions 184 and 550 nm in regions other than the region covering the plurality of protrusions 184.

Two conductive layers 193 and 194 are disposed on the bottom surface of the semiconductor portion 180. In the plan view, the conductive layers 193 and 194 each have a substantially rectangular shape. The conductive layer 193 is electrically connected to the n electrode 186 via the opening 191 of the insulating layer 189. Consequently, the conductive layer 193 is connected to the n-type layer 183 via the n electrode 186. The conductive layer 194 is connected to the p-type layer 181 via the opening 192 of the insulating layer 189. The conductive layers 193 and 194 each are, for example, a layered structure in which a plurality of metal layers are layered. The conductive layers 193 and 194 may each be, for example, a layered structure in which a Ti layer, a rhodium (Rh) layer, and an Au layer are layered in order from the layer proximate to the semiconductor portion 180. In the above layered structure, for example, the thickness of the Ti layer is 3.5 nm, the thickness of the Rh layer is 400 nm, and the thickness of the Au layer is 100 nm.

As described above, the light-emitting element 130 of the present embodiment corresponds to the first light-emitting element 10 and the second light-emitting element 70 of the first embodiment. The semiconductor portion 180 of the present embodiment corresponds to the semiconductor portion 11 of the first embodiment. The n electrode 186, the p electrode 187, the conductive layer 193, and the conductive layer 194 of the present embodiment correspond to the light reflecting layer 12 of the first embodiment.

Next, a method for manufacturing the light-emitting module according to the present embodiment will be described.

As illustrated in FIGS. 19 and 22, the plurality of light-emitting elements 130 are provided. At this time, as described in the first embodiment, appearance inspection and/or electrical characteristics evaluation are performed on the light-emitting elements 130, and a light-emitting element 130 (corresponding to the first light-emitting element 10n) determined to be a defective product without satisfying the criteria of a non-defective product is removed. Then, a new light-emitting element 130 (corresponding to the second light-emitting element 70) is disposed in a region from which the light-emitting element 130 determined to be a defective product has been removed. Then, all the light-emitting elements 130 are mounted on the wiring substrate 120.

Subsequently, the first resin 140 is formed to cover the wiring substrate 120 and the light-emitting elements 130. Subsequently, the first resin 140 is removed from the light-emitting elements 130. Subsequently, the wiring substrate 120 is placed on the package substrate 110 via, for example, a silicone silver paste. Subsequently, the first pads 112 of the package substrate 110 and the external connection pads of the wiring substrate 120 are connected by the wires 160. Subsequently, the first resin frame 171 is formed on the package substrate 110, and the second resin frame 172 is formed on the wiring substrate 120. Subsequently, the protective resin 173 is formed between the first resin frame 171 and the second resin frame 172. This results in the formation of the third resin 170 that protects the wires 160.

Subsequently, the second resin 150 in a semi-cured state processed into a sheet shape is disposed on the plurality of light-emitting elements 130 and on the first resin 140. As described above, in the second resin 150, the phosphors 152 are contained in the base material 151. The second resin 150 is disposed inside the third resin 170 in the plan view. The second resin 150 is disposed to cover the region where the plurality of light-emitting elements 130 are disposed.

Subsequently, the second resin 150 is cured by heat treatment. At this time, when the second resin 150 is heated at a first temperature, for example 100° C., the second resin 150 is once liquefied and enters a space on the first resin 140, which is a gap between the light-emitting elements 130. As a result, the second resin 150 comes into contact with upper portions of the lateral surfaces 133 of the light-emitting element 130. Subsequently, when the second resin 150 is heated at a second temperature higher than the first temperature, for example 150° C., the second resin 150 is finally cured. In this way, the light-emitting module 101 according to the present embodiment is manufactured.

Fourth Embodiment

The fourth embodiment is an example of manufacturing a light-emitting module by using the method for manufacturing a light-emitting device according to the second embodiment described above.

First, the configuration of a light-emitting module according to the present embodiment will be described.

Figure 26A:
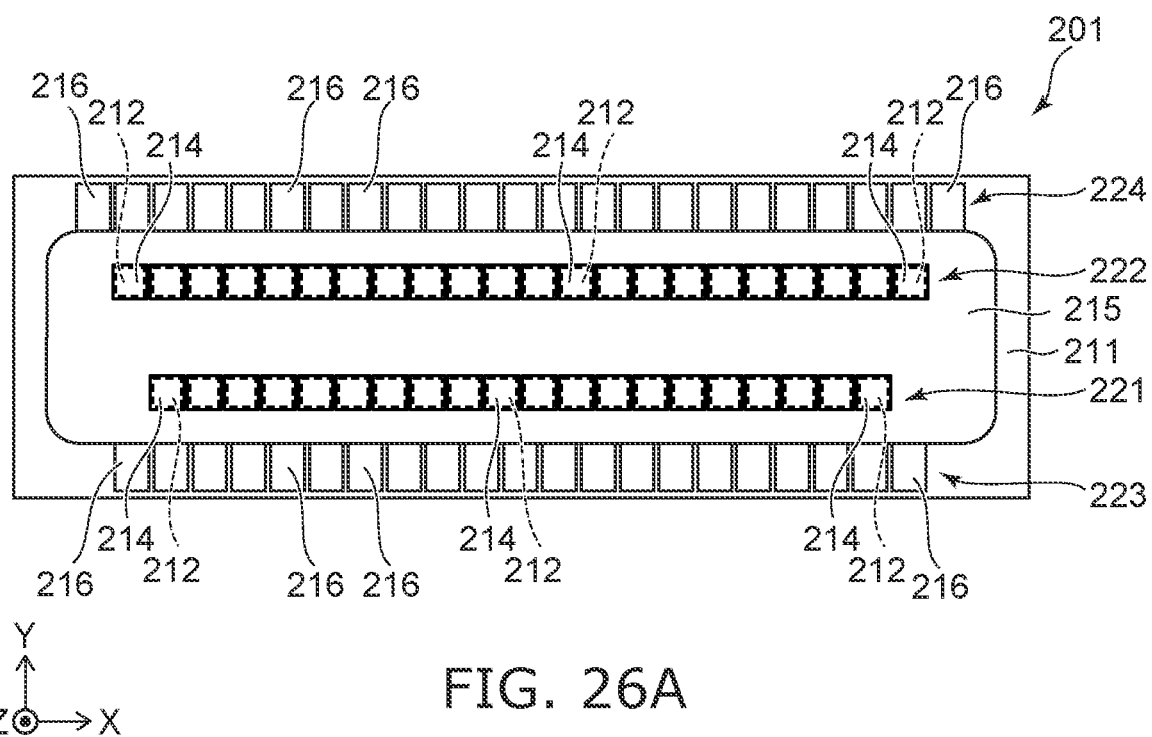
FIG. 26A is a top view schematically illustrating a light-emitting module according to a fourth embodiment.

FIG. 26A is a top view illustrating the light-emitting module according to the present embodiment.

Figure 26B:
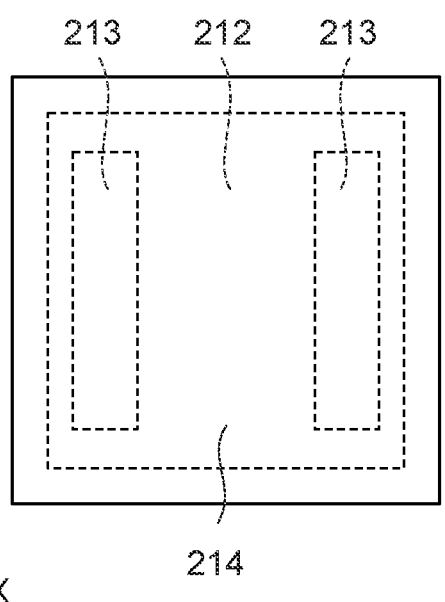
FIG. 26B is a partially enlarged top view schematically illustrating one light-transmissive member.

FIG. 26B is a partially enlarged top view illustrating one light-transmissive member. Also in the present embodiment, the XYZ Cartesian coordinate system is employed similarly to the third embodiment.

As illustrated in FIGS. 26A and 26B, a light-emitting module 201 according to the present embodiment includes a wiring substrate 211. In a plan view, the wiring substrate 211 has, for example, a rectangular shape. A plurality of light-emitting elements 212 are mounted on a top surface of the wiring substrate 211. Two bonding sections 213 are disposed on each of the light-emitting elements 212, and the light-emitting elements 212 are mounted on the wiring substrate 211 via the bonding sections 213. The bonding section 213 includes, for example, gold or copper.

On the top surface of the wiring substrate 211, the light-emitting elements 212 are arranged in two rows, for example. Each row extends in the longer direction of the wiring substrate 211, that is, the X direction. In a first row 221, for example, 20 light-emitting elements 212 are arranged, and in a second row 222, for example, 22 light-emitting elements 212 are arranged. Consequently, a total of 42 light-emitting elements 212 are disposed in the light-emitting module 201. In an example, each of the light-emitting elements 212 has a square shape in the plan view, and the length of one side is in a range from 500 μm to 1000 μm.

A light-transmissive member 214 is disposed on each of the light-emitting elements 212. The light-transmissive member 214 is, for example, a plate-shaped member containing YAG as a phosphor. In an example, each light-transmissive member 214 has a square shape in the plan view, and the length of one side is in a range from 550 μm to 1100 μm. In an example, the distance between adjacent light-transmissive members 214 in each row is in a range from 30 μm to 70 μm. The number of light-transmissive members 214 is the same as the number of light-emitting elements 212.

A resin member 215 is disposed on the wiring substrate 211. The resin member 215 covers the central portion of the top surface of the wiring substrate 211. The resin member 215 covers lateral surfaces of the light-emitting element 212 and lateral surfaces of the light-transmissive member 214 and does not cover a top surface of the light-transmissive member 214. Consequently, the top surface of the light-transmissive member 214 is exposed from the resin member 215. In the resin member 215, for example, a light-reflective material is contained in a light-transmissive resin serving as a base material. The resin is, for example, a dimethyl silicone resin. The light-reflective material is, for example, titanium oxide.

Pads 216 are disposed on both sides in the Y direction of a region of the top surface of the wiring substrate 211 covered with the resin member 215. The pads 216 are arranged in two rows along end edges extending in the X direction of the wiring substrate 211. A third row 223 of the pads 216 is disposed proximate to the first row 221 of the light-emitting elements 212. A fourth row 224 of the pads 216 is disposed proximate to the second row 222 of the light-emitting elements 212.

The number of pads 216 belonging to each row is greater by one than the number of light-emitting elements 212 belonging to a corresponding row. That is, 21 pads 216 are arranged in the third row 223, and 23 pads 216 are arranged in the fourth row 224. The 21 pads 216 belonging to the third row 223 and the 20 light-emitting elements 212 belonging to the first row 221 are alternately connected in series. Similarly, the 23 pads 216 belonging to the fourth row 224 and the 22 light-emitting elements 212 belonging to the second row 222 are alternately connected in series.

The wiring substrate 211 of the present embodiment corresponds to the mounting substrate 80 of the second embodiment. The light-emitting element 212 of the present embodiment corresponds to the first light-emitting element 10g and/or the second light-emitting element 70 of the second embodiment. The resin member 215 of the present embodiment corresponds to the covering member 81 of the second embodiment. The light-transmissive member 214 of the present embodiment corresponds to the light-transmissive member 82 of the second embodiment.

Next, a method for manufacturing the light-emitting module according to the present embodiment will be described.

As shown in FIGS. 26A and 26B, the plurality of light-emitting elements 212 are provided. At this time, as described in the second embodiment, appearance inspection and/or electrical characteristics evaluation are performed on the light-emitting elements 212, and a light-emitting element 212 (corresponding to the first light-emitting element 10n) determined to be a defective product without satisfying the criteria of a non-defective product is removed. Then, a new light-emitting element 212 (corresponding to the second light-emitting element 70) is disposed in a region from which the light-emitting element 212 determined to be a defective product has been removed. Then, all the light-emitting elements 212 are mounted on the wiring substrate 211.

Subsequently, the light-transmissive member 214 is disposed on each of the light-emitting elements 212. Subsequently, the resin member 215 is formed to cover the top surface of the wiring substrate 211, the lateral surfaces of each of the light-emitting elements 212, and the lateral surfaces of each of the light-transmissive members 214. In this way, the light-emitting module 201 according to the present embodiment is manufactured.

Each of the aforementioned embodiments is an example embodying the present invention, and the present invention is not limited to these embodiments. For example, additions, deletions, or changes of some components or steps in each of the aforementioned embodiments are also included in the present invention. Furthermore, the aforementioned embodiments may be implemented in combination with each other.

The present invention can be used, for example, for a headlight of a vehicle, a light source of a display device, or the like.

What is claimed is:

1. A method for manufacturing a light-emitting device comprising:
providing an intermediate body including
a first ultraviolet transmitting layer having a first surface, a first adhesive layer having a second surface in contact with the first surface of the first ultraviolet transmitting layer and a third surface located opposite to the second surface,
   a plurality of first light-emitting elements in contact with the third surface of the first adhesive layer and each including a light reflecting layer located on a side opposite to a side facing the third surface,
   a second adhesive layer comprising a fourth surface in contact with the plurality of first light-emitting elements and a fifth surface located opposite to the fourth surface, and
   a second ultraviolet transmitting layer comprising a sixth surface in contact with the fifth surface of the second adhesive layer and a seventh surface located opposite to the sixth surface;
disposing an ultraviolet shielding layer in a region on the seventh surface of the second ultraviolet transmitting layer, the region corresponding to a part of the plurality of first light-emitting elements;
performing first ultraviolet irradiation of irradiating the intermediate body with ultraviolet from a direction facing the ultraviolet shielding layer;
performing second ultraviolet irradiation of irradiating the intermediate body with ultraviolet from a direction facing the first ultraviolet transmitting layer; and
separating the part of the plurality of first light-emitting elements from the first adhesive layer along with the second adhesive layer,
wherein, after the performing of the first ultraviolet irradiation and the performing of the second ultraviolet irradiation, an adhesive force of a portion of the second adhesive layer irradiated with the ultraviolet is less than an adhesive force of the first adhesive layer, and an adhesive force of a portion of the second adhesive layer not irradiated with the ultraviolet is greater than the adhesive force of the first adhesive layer.

2. The method for manufacturing the light-emitting device according to claim 1, wherein
   the plurality of first light-emitting elements each has a top surface defined by the light reflecting layer in contact with the second adhesive layer, a bottom surface in contact with the first adhesive layer, and a lateral surface between the top surface and the bottom surface, and
   in the intermediate body, the second adhesive layer is in contact with the lateral surface of each of the plurality of first light-emitting elements.

3. The method for manufacturing the light-emitting device according to claim 1, wherein
   the first adhesive layer and the second adhesive layer each includes an ultraviolet reactive layer.

4. The method for manufacturing the light-emitting device according to claim 1, wherein
   the providing of the intermediate body includes
      providing a stacked body in which the first ultraviolet transmitting layer, the first adhesive layer, and the plurality of first light-emitting elements are layered, and
      irradiating the stacked body with ultraviolet from a direction facing the first ultraviolet transmitting layer.

5. The method for manufacturing the light-emitting device according to claim 1, wherein
   a surface of each of the plurality of first light-emitting elements facing the first adhesive layer is greater than a surface of each of the plurality of first light-emitting elements facing the second adhesive layer.

6. The method for manufacturing the light-emitting device according to claim 1, wherein
   the part of the plurality of first light-emitting elements includes at least one defective first light-emitting element, and
   in the separating, a non-defective first light-emitting element among the plurality of first light-emitting elements remains on the first adhesive layer.

7. The method for manufacturing the light-emitting device according to claim 6, further comprising
   before the disposing of the ultraviolet shielding layer, determining whether each of the plurality of first light-emitting elements is the defective first light-emitting element or the non-defective first light-emitting element by evaluating electrical characteristics of each of the plurality of first light-emitting elements.

8. The method for manufacturing the light-emitting device according to claim 6, further comprising
   after the separating, disposing a second light-emitting element in a region where the part of the plurality of first light-emitting elements has been separated.

9. The method for manufacturing the light-emitting device according to claim 8, further comprising
   after the separating, and before the disposing of the second light-emitting element, transferring the non-defective first light-emitting element remaining on the first adhesive layer from the first adhesive layer to a first sheet,
   wherein, the disposing of the second light-emitting element includes disposing the second light-emitting element on the first sheet.

10. The method for manufacturing the light-emitting device according to claim 8, further comprising
   after the disposing of the second light-emitting element, providing a light-transmissive member to cover the first light-emitting element and the second light-emitting element.

* * * * *